(12) United States Patent
Nakamura

(10) Patent No.: US 7,258,423 B2
(45) Date of Patent: Aug. 21, 2007

(54) RECORDING HEAD UNIT, METHOD OF MANUFACTURING THE SAME, AND RECORDING APPARATUS USING THE UNIT

(75) Inventor: Hirotake Nakamura, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 242 days.

(21) Appl. No.: 10/475,838

(22) PCT Filed: Apr. 26, 2002

(86) PCT No.: PCT/JP02/04272

§ 371 (c)(1),
(2), (4) Date: Oct. 24, 2003

(87) PCT Pub. No.: WO02/087887

PCT Pub. Date: Nov. 7, 2002

(65) Prior Publication Data

US 2004/0141028 A1 Jul. 22, 2004

(30) Foreign Application Priority Data

Apr. 26, 2001 (JP) ............... 2001-128842
Apr. 26, 2001 (JP) ............... 2001-128848
Apr. 26, 2001 (JP) ............... 2001-128911

(51) Int. Cl.
*B41J 2/16* (2006.01)
*B41J 2/05* (2006.01)
*H05K 3/36* (2006.01)

(52) U.S. Cl. .............. 347/50; 347/58; 29/830
(58) Field of Classification Search .......... 347/50

See application file for complete search history.

(56) References Cited

U.S. PATENT DOCUMENTS

| 4,319,075 A | * | 3/1982 | Willette ............ 174/117 FF |
| 4,898,544 A | * | 2/1990 | Callahan ............ 439/498 |
| 5,886,414 A | * | 3/1999 | Galloway ............ 257/784 |
| 6,153,832 A | * | 11/2000 | Gaarder ............ 174/254 |

(Continued)

FOREIGN PATENT DOCUMENTS

JP     U 3-55232     5/1991

(Continued)

*Primary Examiner*—Matthew Luu
*Assistant Examiner*—Shelby Fidler
(74) *Attorney, Agent, or Firm*—Oliff & Berridge, PLC

(57) ABSTRACT

A flexible circuit board (15) has one end portion (15a) soldered to a connection terminal row of a side surface (13e) of an ink-jet recording head (13), and extends upwardly from the ink jet recording head (13). The flexible circuit board (15) is bent at a midpoint at substantially right angles in the longitudinal direction of the flexible circuit board (15) to form a crease portion (15c). A forward end of the board (15) extends leftward, and is then folded back by 180 degrees to form a crease portion (15d). The forward end thereof extends rightward, and the forward end portion (15b) is soldered to a terminal row disposed on the back side of a COB substrate (24). A sheet-like double-faced tape having a drum-like cut-out shape is affixed to the crease portion (15c) in advance. When the flexible circuit board is folded along a crease line, the base material of the flexible printed wiring board at the cut-out part is adhered to the doubled-faced tape.

13 Claims, 16 Drawing Sheets

U.S. PATENT DOCUMENTS

| | | |
|---|---|---|
| 6,206,507 B1 * | 3/2001 | Hino .......................... 347/50 |
| 6,454,394 B2 * | 9/2002 | Shibano et al. ............... 347/49 |
| 6,483,713 B2 * | 11/2002 | Samant et al. .............. 361/749 |
| 6,723,925 B2 * | 4/2004 | Ohara et al. ............ 174/113 R |
| 6,886,914 B2 * | 5/2005 | Hiramoto et al. ............. 347/50 |
| 2002/0030715 A1 * | 3/2002 | Takata et al. ................. 347/37 |
| 2004/0174412 A1 * | 9/2004 | Ohashi et al. ................ 347/50 |

FOREIGN PATENT DOCUMENTS

| JP | A 9-174840 | 7/1997 |
|---|---|---|
| JP | A 9-267534 | 10/1997 |

* cited by examiner

RECORDING HEAD UNIT, METHOD OF MANUFACTURING THE SAME, AND RECORDING APPARATUS USING THE UNIT

TECHNICAL FIELD

The present invention relates to a recording head unit, a flexible circuit board for use in a recording head unit, a recording apparatus with a recording head unit incorporated therein, and a method of manufacturing a recording head unit. More specifically, the present invention relates to a recording head unit having with a, recording head for recording on a recording medium, a drive circuit board for driving the recording head, and a flexible circuit board for transmitting a signal from the drive circuit board to the recording head, and to a recording apparatus having the recording head unit.

BACKGROUND ART

One of well-known recording apparatus for recording on a recording medium such as paper is an ink jet printer. In an ink jet printer, a recording head unit having a recording head is mounted on a carriage, which is reciprocated parallel to a platen for feeding the recording medium for recording. FIG. 22 shows an example of the recording head unit for an ink jet printer. In this example, one end portion 302a of a flexible circuit board 302 is soldered to the right-hand side surface of a recording head 300. One end portion 303a of a flexible circuit board 303 is soldered to the left-hand side surface of the recording head 300. The other end portion 302b of the flexible circuit board 302 is soldered to an end portion of the back surface of a drive circuit board 304 for generating a signal for driving the recording head 300.

In this case, the flexible circuit board 302 and the flexible circuit board 303 are symmetrically arranged, so that two different types of flexible circuit boards are necessary to be prepared, which results in increasing the number of parts. An attempt to solve this problem is to bend an unbent, straight flexible circuit board in a direction substantially perpendicular to the longitudinal direction thereof, bend another flexible circuit board of the same configuration in a direction opposite to the above-mentioned direction perpendicularly to the longitudinal direction thereof, and solder these flexible circuit boards respectively to the right-hand and left-hand side surfaces of the recording head 300. The above attempt succeeded reducing the number of parts. In this regard, the crease portions may be secured in position by tapes to prevent the crease portions from being separated.

However, the above technique rises a problem in that it takes time to bend the flexible circuit boards in directions perpendicular to the longitudinal direction thereof and to secure the crease portions in position by tapes. Further, since the outer side of the fold imparted to the circuit board is taped, the fold is subject to rising.

Furthermore, continuity of the flexible circuit board to the recording head is examined after soldering one end portion of the flexible circuit board to the recording head and the other end portion thereof to the drive circuit board. Only the recording heads which have proved the continuity pass through the examination. If a recording head turns out to be defective, that recording head is to be disposed of along with the flexible circuit board and the drive circuit board, which results in wasting the expensive drive circuit board.

In view of this, it is an object of the present invention to provide a flexible circuit board by which two different types of the flexible circuit board can be formed.

Another object of the invention is to provide a recording head unit having the above flexible circuit board and a recording apparatus including the recording head.

Further object of the present invention is to provide a recording head unit and a method of manufacturing the same which minimize waste of the drive circuit board.

Still another object of the present invention is to provide a flexible circuit board, a recording head unit provided with the flexible circuit board, and a recording apparatus which require no post-taping of the crease portion of the flexible circuit board.

DISCLOSURE OF THE INVENTION

To achieve the above-mentioned objects, a recording apparatus is provided. The apparatus includes a recording head recording on a recording medium; a drive circuit board sending out a signal for driving the recording head; and a flexible circuit board, each of which has a flexible strip-like insulator and a plurality of conductors arranged on the strip-like insulator. The flexible circuit boards transmits the signal from the drive circuit board to the recording head. The recording head has a pair of opposing connecting portions for receiving the signal. The drive circuit board has a pair of connecting portions situated substantially at right angles with respect to a plane containing the connecting portions of the recording head. The pair of connecting portions is connected to the flexible circuit board. The flexible circuit boards are paired in correspondence with the connecting portions of the recording head. Portions of the flexible circuit board connected to the connecting portions of the flexible circuit board are opposed to each other. The flexible circuit board is bent substantially at right angles with respect to the longitudinal direction between the recording head and the drive circuit board and folded back by 180 degrees.

In this recording apparatus, constructed as described above, the pair of flexible circuit boards are bent substantially at right angles with respect to the longitudinal direction thereof and folded back by 180 degrees. Therefore, one type of the flexible circuit board accomplishes connection between the recording head and the drive circuit board. Thus, by using one type of flexible circuit board, it is possible to form two different types of symmetrical flexible circuit boards, thereby reducing the number of parts and achieving a reduction in cost.

In this recording apparatus, it is preferable that the portions of the pair of flexible circuit boards connected to the drive circuit board are connected to the same side of the drive circuit board. By folding back the flexible circuit boards as described above, one ends thereof are opposed to the connecting portions of the recording head. The portions of the pair of flexible circuit boards connected to the drive circuit board are also opposed to each other prior to the connection to the drive circuit board. The above arrangement facilitates connection to the pair of connecting portions of the drive circuit board to the flexible circuit board.

Further, in this recording apparatus, it is preferable that the portions of the pair of flexible circuit boards connected to the drive circuit board are connected to the same side of the drive circuit board. The connecting portions of the pair of flexible circuit boards which oppose to each other can be readily connected to the same side of the drive circuit board.

Further, in this recording apparatus, it is preferable that the pair of flexible circuit boards is made of flexible circuit boards of the same configuration and the same electric circuit. The flexible circuit boards of the same configuration and the same wiring are bent and folded back as described above. The above flexible circuit board allows connection between the recording head and the drive circuit board. By using flexible circuit boards of the same configuration and the same wiring, it is possible to reduce the number of parts.

Further, in this recording apparatus, it is preferable that the recording head is provided with a plurality of recording elements arranged in two rows and that the pair of connecting portions of the recording head is provided on side surfaces parallel to the rows of recording elements. The pair of flexible circuit boards is connected to the connecting portions on both side surfaces of the recording head, and supply signals to the two rows of recording elements. The recording head has a plurality of recording elements arranged in two rows. The pair of connecting portions of the recording head are provided on side surfaces parallel to the rows of recording elements. Therefore, it is also possible to connect the flexible circuit boards to a recording head having rows of recording elements in high resolution arrangement.

The present invention further provides a flexible circuit board connecting a recording head to a drive circuit board. The recording head records on a recording medium. The drive circuit board sends out a signal for driving the recording head. The flexible circuit board has a flexible strip-like insulator; and a plurality of conductors arranged on the strip-like insulator, the flexible circuit board transmitting the signal from the drive circuit board to the recording head. The flexible circuit board is bent substantially at right angles with respect to the longitudinal direction thereof and folded back by 180 degrees.

The flexible circuit board of this construction is bent substantially at right angles with respect to the longitudinal direction thereof, and folded back by 180 degrees. Therefore, connection is possible to the sides of both the drive circuit board and the recording head. Thus, it is possible to form flexible circuit boards of two different types having symmetrical configurations by using one type of flexible circuit board having the same configuration. Accordingly, decrease in the number of parts and a reduction in cost are achieved.

The present invention further provides a recording head unit having a recording head recording on a recording medium; and a flexible circuit board having a flexible strip-like insulator and a plurality of conductors arranged on the strip-like insulator. The flexible circuit board transmits a signal from a drive circuit board to the recording head. The flexible circuit board is provided with a connecting portion connectable to the drive circuit board. An electrode portion extends from the connecting portion for checking continuity to the recording head.

In this recording head unit, the flexible circuit board for transmitting a signal from the drive circuit board to the recording head is provided with a connecting portion allowing connection to the drive circuit board. An electrode portion for checking the continuity to the recording head extends from the connecting portion. Therefore, it is possible to examine the operations of the recording head by utilizing the electrode portion prior to the connection of the flexible circuit board to the drive circuit board. Thus, if the recording head proves to be defective upon drive check, the drive circuit board has not been connected to the flexible circuit board yet, thereby avoiding waste of the flexible circuit board.

In this recording head unit, it is preferable that the electrode portion is separable from the connecting portion for connection to the drive circuit board. In this construction, after checking the operations of the recording head by utilizing the electrode portion, it is possible to cut off the electrode portion from the connecting portion for connection between the flexible circuit board and the drive circuit board. Thereafter, the connecting portion is connected to the drive circuit board.

It is preferable that the recording head has a pair of opposed connecting portions for receiving the signal. The flexible circuit board are paired in correspondence with the connecting portions of the recording head. The portions of the flexible circuit board connected to the connecting portions of the recording head are opposed to each other. In this construction, it is possible to check operations of the recording head through the pair of opposing connecting portions of the recording head and the flexible circuit boards.

The present invention further provides a recording apparatus having a recording head recording on a recording medium; a drive circuit board sending out a signal for driving the recording head; and a flexible circuit board having a flexible strip-like insulator and a plurality of conductors ($15i$) arranged on the strip-like insulator. The flexible circuit board transmits the signal from the drive circuit board to the recording head. The flexible circuit board is bent substantially at right angles with respect to the longitudinal direction thereof. The flexible circuit board has four regions defined by a crease line of a crease portion bent substantially at right angles and another crease line orthogonal to the crease line. A pair of regions opposed to each other with the two lines therebetween is provided with adhesive. Each of the pair of regions respectively is joined to the adjacent region.

In this recording apparatus, the flexible circuit board is bent substantially at right angles with respect to the longitudinal direction thereof. Four regions of the flexible circuit board are defined by the crease line of the crease portion and the line orthogonal to the crease line. Among four regions, a pair of regions opposed to each other with both lines therebetween is provided with adhesive, so that the pair of regions are reliably attached respectively to the other regions adjacent thereto.

In this recording apparatus, it is preferable that a pair of regions arranged in the longitudinal direction of the four regions of the flexible circuit board (51) is provided with the adhesive. In this construction, four regions of the flexible circuit board are defined by the crease line of the crease portion and the line perpendicular to the crease line. Among four regions, the longitudinal pair of regions of the flexible circuit board are provided with adhesive. The forming of the flexible circuit board can be effected by forming a plurality of flexible circuit boards in a direction parallel to the longitudinal direction thereof, providing adhesive so as to be perpendicular to each flexible circuit board, and die-cutting the flexible circuit boards integrated with the adhesive. Accordingly, manufacturing efficiency is improved.

Alternatively, it is preferable that the adhesive can be provided in the lateral pair of regions perpendicular to the longitudinal direction of the flexible circuit board among the four regions of the flexible circuit board. In this construction, the same effect is to be expected.

Further, it is preferable that the adhesive is provided so as to be spaced apart from and in the vicinity of the crease line of the flexible circuit board. Due to this arrangement, no adhesive enters the crease line portion of the crease portion, thereby preventing the crease line portion from swelling. Thus, it is possible to appropriately impart a crease line to the crease portion, thereby more reliably preventing the crease portion from rising.

Further, in this recording apparatus, it is preferable that the adhesive is a double-faced tape. The usage of the double-faced tape facilitates the attaching operation, thereby improving the operational efficiency in the manufacturing of the flexible circuit board.

The present invention further provides a flexible circuit board connecting a recording head to a drive circuit board. The recording head records on a recording medium. The drive circuit board sends out a signal for driving the recording head. The flexible circuit board has a flexible strip-like insulator (15h); and a plurality of conductors (15i) arranged on the strip-like insulator. The flexible circuit board transmits the signal from the drive circuit board to the recording head. The flexible circuit board is bent substantially at right angles with respect to the longitudinal direction thereof. The flexible circuit board has four regions are defined by a crease line of a crease portion and another line orthogonal to the crease line. A pair of opposed regions is provided with adhesive prior to bend of the flexible circuit board.

In this flexible circuit board, the four regions are defined by the crease line of the crease portion and the line perpendicular to the crease line prior to bending substantially at right angles with respect to the longitudinal direction thereof. Among the four regions, a pair of opposed regions is provided with adhesive. Accordingly, the pair of regions are reliably attached to the other regions adjacent thereto, after the flexible circuit board has been bent.

In this flexible circuit board, a pair of regions arranged in a width direction perpendicular to the longitudinal direction of the four regions of the flexible circuit board is provided with the adhesive. Due to this arrangement, the flexible circuit board can be formed by forming a plurality of flexible circuit boards in a direction parallel to the longitudinal direction thereof, providing adhesive so as to be perpendicular to each flexible circuit board, and die-cutting the flexible circuit boards integrated with the adhesive. Accordingly, manufacturing efficiency is improved.

Further, in this flexible circuit board, the adhesive is provided so as to be spaced apart from and in the vicinity of the crease line of the crease portion prior to bend of the flexible circuit board. In this construction, the adhesive is provided on the flexible circuit board so as to be spaced apart from and in the vicinity of the crease line. Therefore, no adhesive enters the crease line portion of the crease portion, thereby preventing the crease line portion from swelling. Thus, it is possible to properly impart a crease line to the crease portion, thereby more reliably preventing the crease portion from rising.

Further, in this flexible circuit board, it is preferable that the adhesive is a double-faced tape. The usage of the double-faced tape facilitates the attaching operation, and can improve the efficiency in the manufacturing of the flexible circuit board.

The present invention further provides a method of manufacturing a recording head unit having a flexible circuit board connecting a recording head to a drive circuit board. The recording head records on a recording medium. The drive circuit board sends a signal for driving the recording head. The flexible circuit board has a flexible strip-like insulator and a plurality of conductors arranged on the strip-like insulator. The flexible circuit board transmits the signal from the drive circuit board to the recording head. The method has providing a connecting portion for connection to the drive circuit board at one end of the flexible circuit board, and forming an electrode portion extending from the connecting portion for checking continuity to the recording head; connecting another end of the flexible circuit board to the recording head; applying a signal to the electrode portion for checking operations of the recording head; and separating the electrode portion from the flexible circuit board, and connecting the drive circuit board to the connecting portion.

In the above-described method of manufacturing a recording head unit, the electrode is cut off from the flexible circuit board, and the drive circuit board is connected to the connecting portion, when the recording head proves to be satisfactory upon drive check. Thus, in case that the recording head turns out to be defective upon drive check, the drive circuit board is not connected to the flexible circuit board yet. Therefore, waste of the drive circuit board can be avoided.

BEST MODE FOR CARRYING OUT THE INVENTION

A recording apparatus according to an embodiment of the present invention will now be described with reference to the drawings. First, the inner construction of an ink jet printer 1 according to an embodiment of the present invention will be described with reference to FIG. 1.

Figure 1:
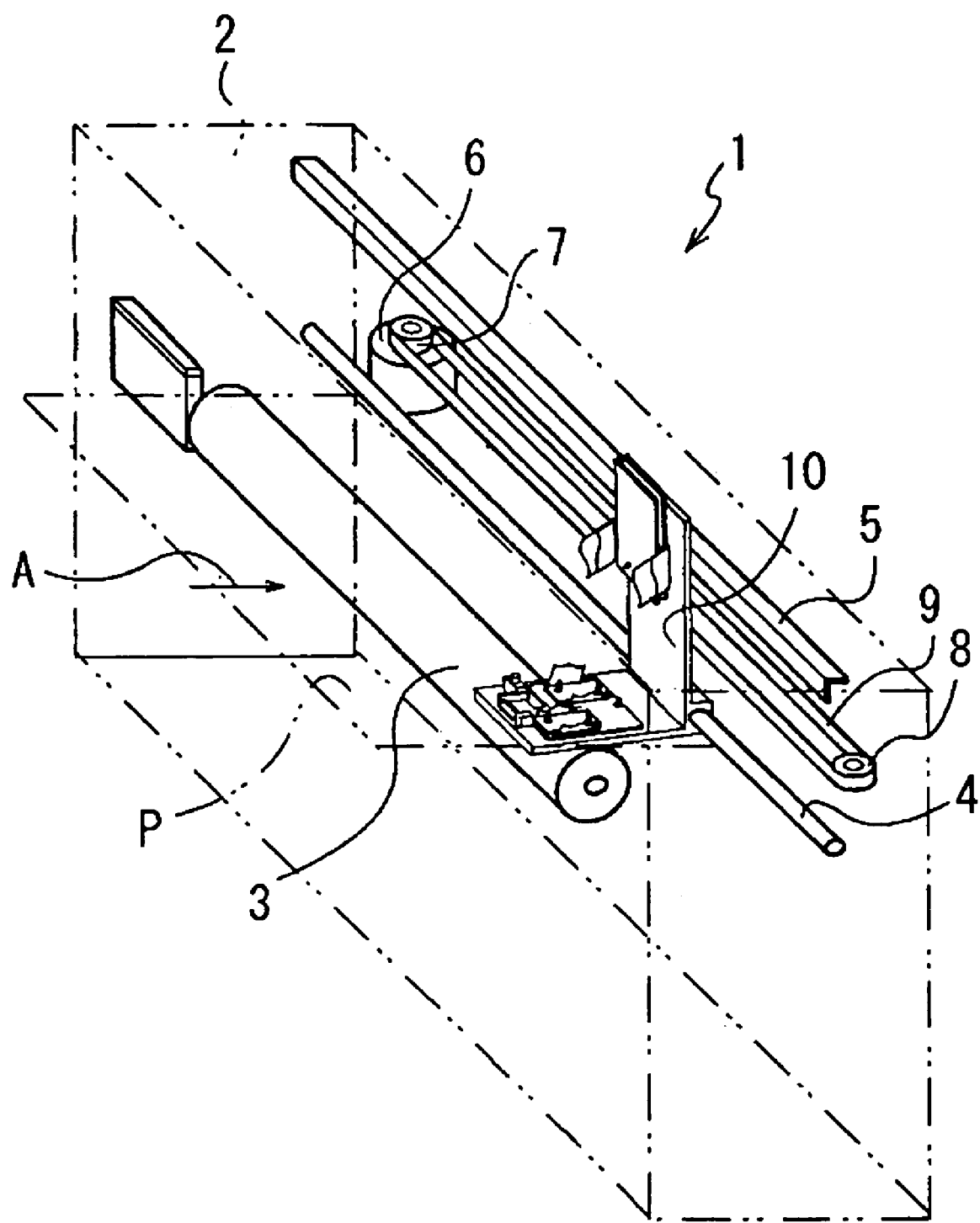
FIG. 1 is a perspective view of an ink jet printer.

As shown in FIG. 1, the ink jet printer 1 has a platen roller 3 in a casing 2 for transporting a recording sheet P. The platen roller 3 is rotated by driving an LF motor (not shown). By the rotation of the platen roller 3, the recording sheet P is transported in the direction of an arrow A in FIG. 1. Further, a carriage 10 is provided opposite to the platen roller 3. A guide member 5 and a guide rod 4 of a round bar are arranged parallel to the platen roller 3. The carriage 10 is capable of being reciprocated parallel to the platen roller 3 by the guide rod 4 and the guide member 5. A pulley 7 is fixed to the shaft portion of a CR motor 6 near to the left-hand internal end of the casing 2 as shown in FIG. 1. Another pulley 8 is provided at the right-hand internal end of the casing 2 as seen in FIG. 1. The carriage 10 is firmly attached to a belt 9 stretched between the pulley 7 and the pulley 8. The carriage 10 is reciprocated parallel to the platen roller 3 by driving the CR motor 6.

Figure 2:
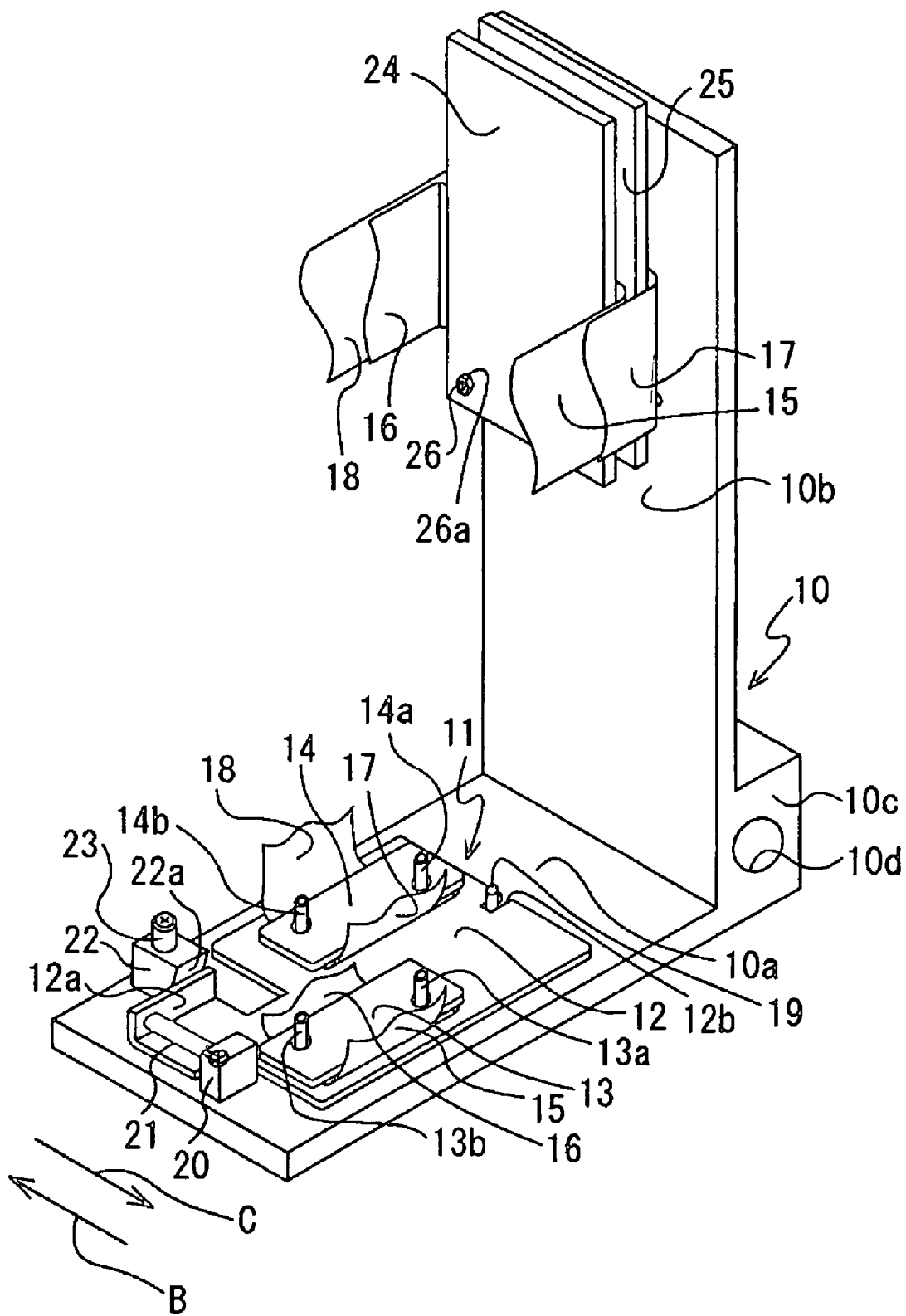
FIG. 2 is a perspective view of a carriage of a recording apparatus according to an embodiment of the present invention.
Figure 3:
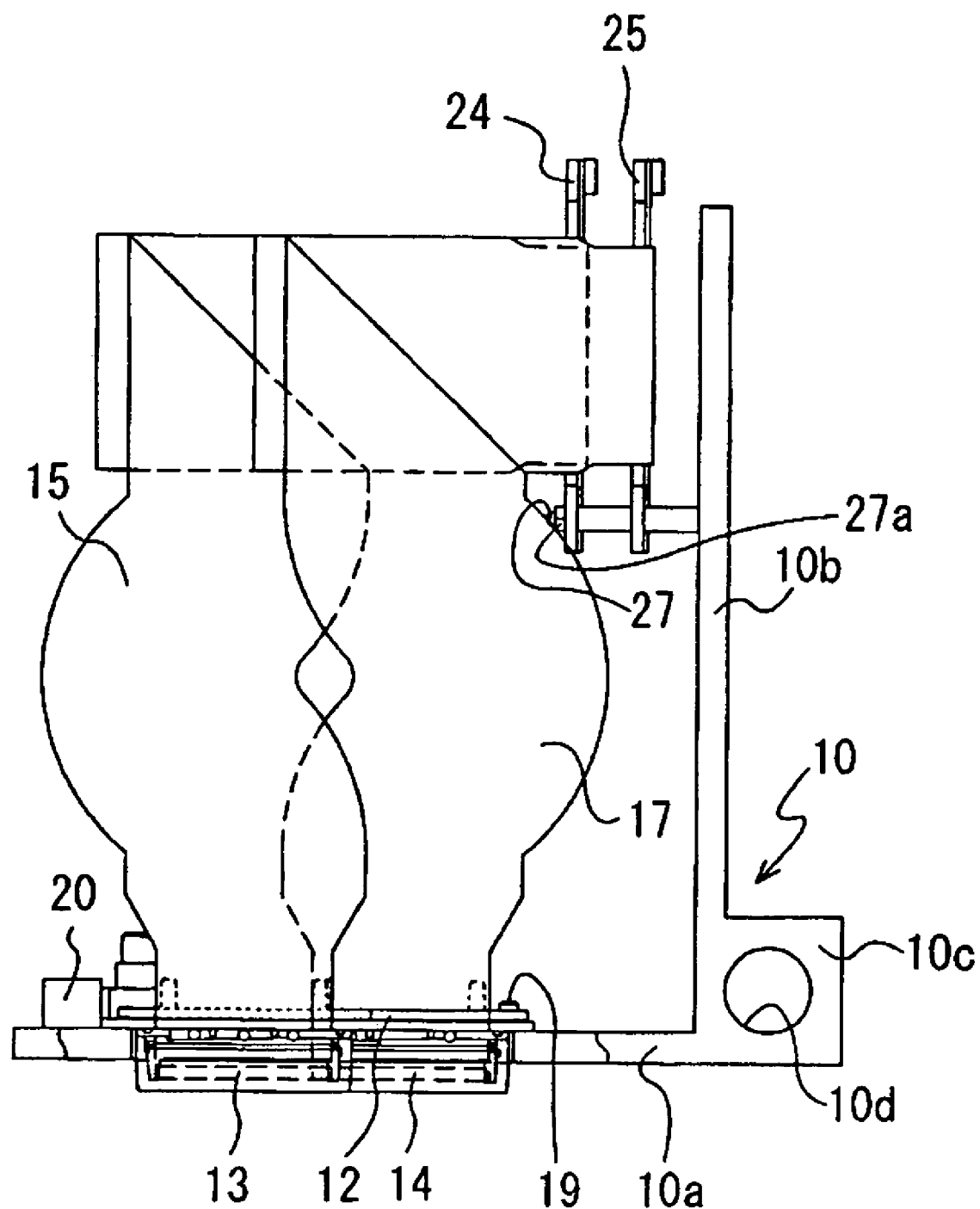
FIG. 3 is a right-hand side view of the carriage.

Next, the construction of the carriage 10 and a head module 11 will be described with reference to FIGS. 2 through 6. As shown in FIGS. 2 and 3, the carriage 10 is formed as an integral unit from a metal such as die-cast aluminum. The carriage 10 includes a substantially rectangular bottom plate 10a, a substantially rectangular vertical plate 10b vertically extending from an end of the bottom plate 10a, and a parallelepiped-shaped guide portion 10c. The parallelepiped-shaped guide portion 10c is provided on the outer side of the vertical plate 10b extending vertically from the bottom plate 10a. The parallelepiped-shaped guide portion 10c has a through-hole 10d through which the guide rod 4 is to be passed. Thus, as shown in FIG. 3, the right-hand side surface of the carriage 10 has a reverse-L-shaped configuration. Further, the vertical plate 10b has an attachment portion (not shown) on its back side for fixing the carriage to the belt 9.

Next, as shown in FIGS. 2 through 5, a rectangular base plate 12 is provided on the top surface of the bottom plate 10a of the carriage 10. The base plate 12 has ink jet recording heads 13 and 14 (described below) inserted for fixation. The base plate 12 is formed of a metal plate (e.g., a cold-rolled steel plate) by pressing. The base plate 12 has an abutment portion 12a and a cutout 12b which are described below. The base plate 12 and the ink jet recording heads 13 and 14 constitute the head module 11.

Further, a pin 19, a spring retaining portion 20 retaining a coil spring 21 for urging the base plate 12 in the direction of an arrow B in FIG. 2, and a position adjusting wedge 22 for moving the base plate 12 in, the direction indicated by an arrow C in FIG. 2 are provided on the upper surface of the bottom plate 10a of the carriage 10. The cutout 12b of the base plate 12 is engaged with the pin 19, so that the base plate 12 is supported so as to be rotatable about the pin 19 in the plane parallel to the direction in which the carriage 10 moves. The position adjusting wedge 22 is provided with a screw 23 and an inclined surface 22a. The screw 23 extends through the position adjusting wedge 22 to be threadedly engaged with a screw hole (not shown) in the upper surface of the bottom plate 10a. The inclined surface 22a is moved from and to the bottom plate 10a of the carriage 10 with the screwing motion of the screw 23, thereby urging the base plate 12 so as to rotate in the direction of the arrow C in FIG. 2. By fastening the screw 23, the abutment portion 12a of the base plate 12 is urged against the position adjusting wedge 22, depending on the fastening amount. Therefore, the base plate 12 is rotated about the pin 19 in the direction of the arrow C in FIG. 2. By loosening the screw 23, the base plate 12 can be rotated about the pin 19 in the direction of the arrow B in FIG. 2 by the elastic force of the coil spring 21, depending on the loosening amount. Further, a part of the abutment portion 12a of the base plate 12 which abuts the position adjusting wedge 22 has an arcuate end edge due to the so-called shear drop of the contour of the base plate 12, which is formed through press working by a female die.

Figure 5:
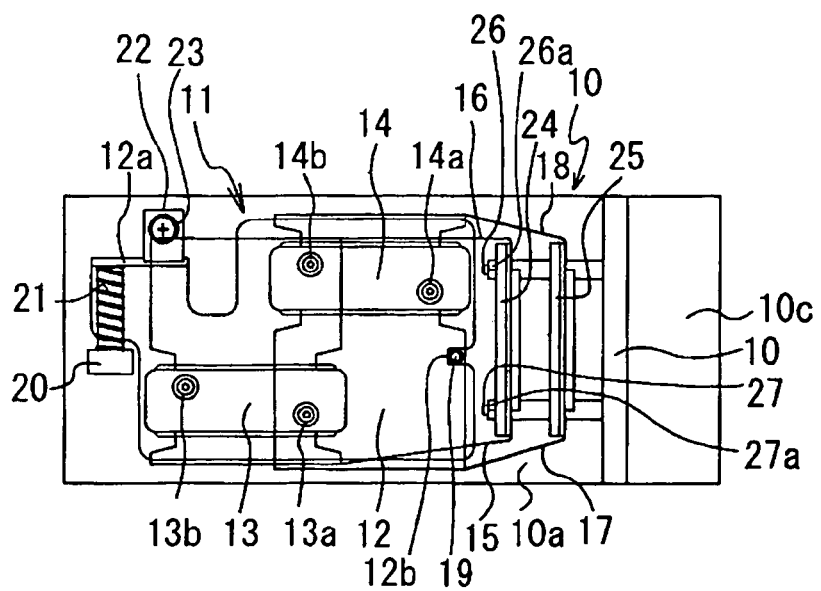
FIG. 5 is a plan view of the carriage.
Figure 6:
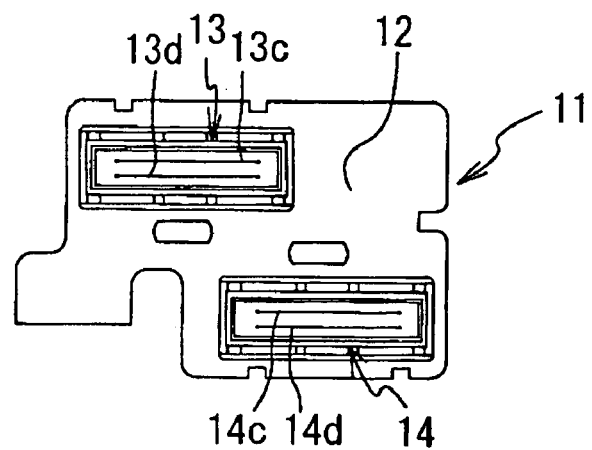
FIG. 6 is a bottom view of a head module of a recording head according to an embodiment of the present invention.
Figure 7:
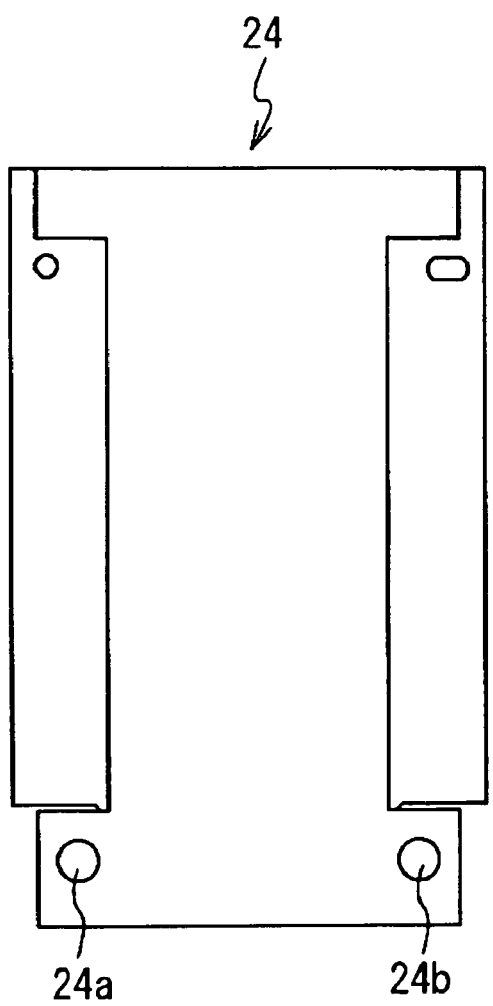
FIG. 7 is a front view of a drive circuit board (COB substrate) according to an embodiment of the present invention.

Further, as shown in FIGS. 2, 5, and 6, the base plate 12 has the ink jet recording heads 13 and 14. The recording head 13, 14 are substantially rectangular in plan view, and arranged offset and parallel to each other with a fixed space therebetween. Similar recording heads to the recording head 13, 14 are disclosed in Japanese patent publication (JP 11-286111). The ink jet recording heads 13 and 14 are formed of a piezoelectric material, and have a lot of ejection channels (not shown) arranged in two rows for containing ink. The recording head 13, 14 has a nozzle connected to each of the ejection channels. Further, rows of connection terminals (not shown) respectively connected to the drive elements of the ejection channels are provided on both side surfaces of each recording head which are parallel to the ejection channel rows.

As shown in FIG. 6, two nozzle rows 13c and 13d for ejecting ink are arranged in parallel in the bottom surface of the ink jet recording head 13. Each of the nozzle rows 13c and 13d has 150 nozzles arranged in a row at a resolution of 150 dpi. The nozzle rows 13c and 13d are offset from each other by a half pitch. Thus, the ink jet recording head 13 alone provides a resolution of 300 dpi. Further, two nozzle rows 14c and 14d for ejecting ink are arranged in the bottom surface of the ink jet recording head 14. Each of the nozzle rows 14c and 14d has 150 nozzles arranged in a row at a resolution of 150 dpi. The nozzle rows 14c and 14d are offset from each other by a half pitch. Thus, the ink jet recording head 14 alone also provides a resolution of 300 dpi. The recording heads 13 and 14 are aligned such that the head module 11 as a whole has 600 nozzles aligned in the direction perpendicular to the direction in which the carriage 10 moves.

Further, as shown in FIGS. 2 and 5, ink supply ports 13a and 13b which have openings in the upper surface of the carriage bottom plate 10a are provided in the upper surface of the ink jet recording head 13. Therefore, ink is supplied from an ink tank (not shown) to the ink supply ports 13a and 13b. Further, similar ink supply ports 14a and 14b are provided in the upper surface of the ink jet recording head 14. Therefore, ink is supplied from an ink tank (not shown) the ink supply ports 14a and 14b. Chip-on-board substrates (hereinafter referred to as the "COB substrates") 24 and 25 are situated on the vertical plate 10b side to define an open space above the ink supply ports 13a, 13b, 14a, and 14b. Accordingly, direct connection of the ink tank to the ink supply ports and connection of the ink supply ports to tubes extending from the ink tank are facilitated.

The COB substrates 24 and 25 are substantially rectangular drive circuit boards for generating ejection pulses as drive signals for driving the ink jet recording heads 13 and 14. As shown in FIGS. 2 through 5, the COB substrates 24 and 25 are fixed to fixation shaft portions 26 and 27 in the upper portion of the vertical plate 10b of the carriage 10 by means of lock nuts 26a and 27a.

Figure 4:
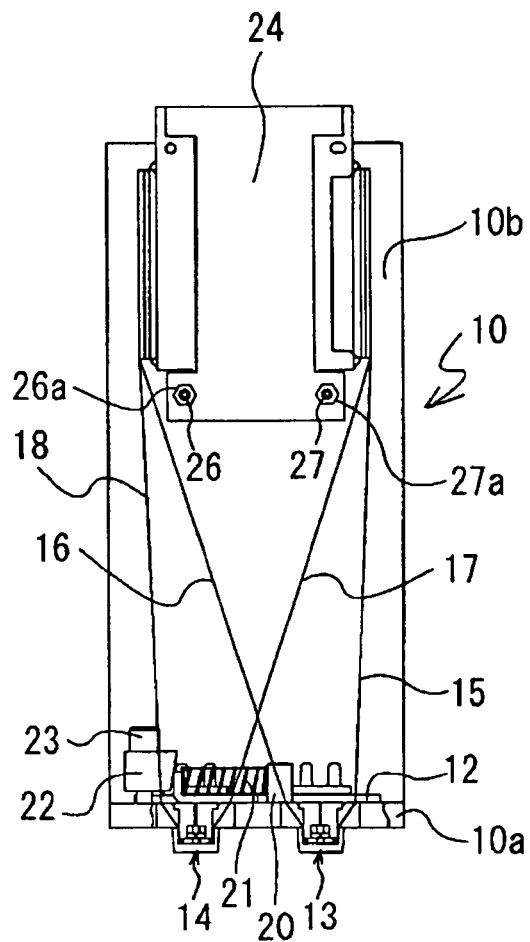
FIG. 4 is a front view of the carriage.

Further, as shown in FIGS. 2 and 4, one end portion of a flexible circuit board 15 is soldered to a connection terminal row (not shown) on the right-hand side surface of the ink jet recording head 13. The other end portion of the flexible circuit board 15 is soldered to the right-hand end portion of the back surface of the COB substrate 24. Further, one end portion of a flexible circuit board 16 is soldered to a connection terminal row (not shown) on the left-hand side surface of the ink jet recording head 13. The other end portion of the flexible circuit board 16 is soldered to the left-hand end portion of the back surface of the COB substrate 24. Thus, the flexible circuit boards 15 and 16 are provided in a pair in correspondence with the connection terminal rows on the side surfaces of the ink jet recording head 13.

Further, one end portion of a flexible circuit board 17 is soldered to a connection terminal row (not shown) on the right-hand side surface of the ink jet recording head 14. The other end portion of the flexible circuit board 17 is soldered to the right-hand end portion of the back surface of the COB substrate 25. Also, one end portion of a flexible circuit board 18 is soldered to a connection terminal row (not shown) on the left-hand side surface of the ink jet recording head 14. The other end portion of the flexible circuit board 18 is soldered to the left-hand end portion of the back side of the COB substrate 25. Thus, the flexible circuit boards 17 and 18 are provided in a pair in correspondence with the connection terminal rows on the side surfaces of the ink jet recording head 14.

Figure 8:
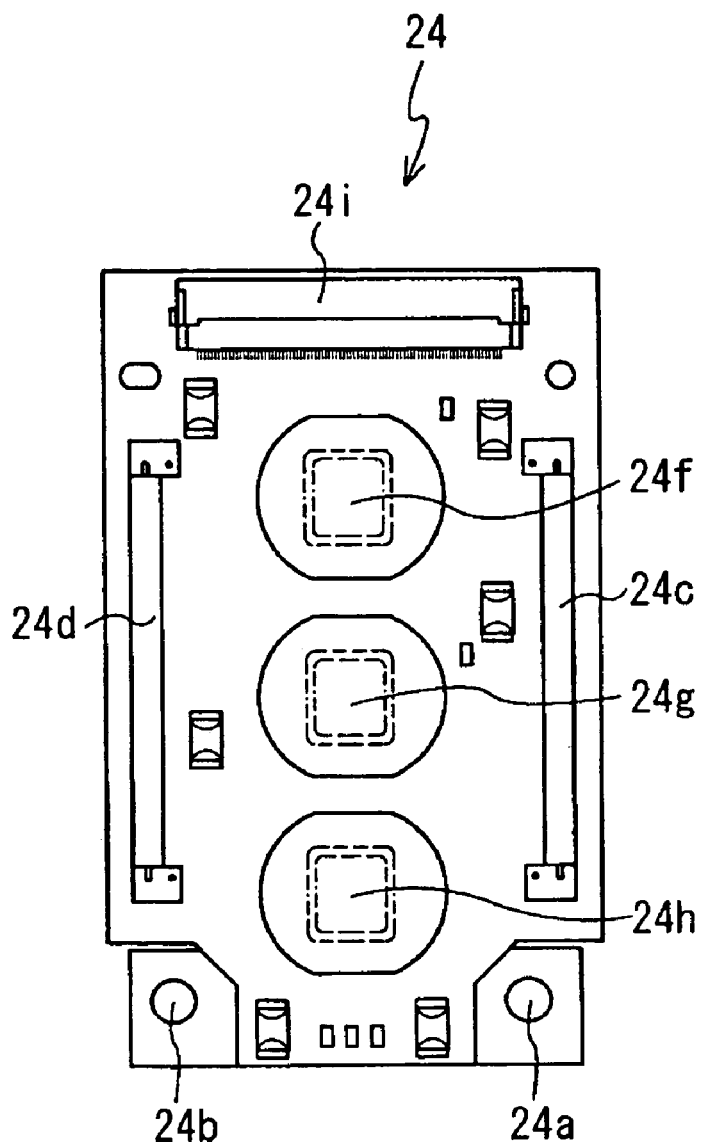
FIG. 8 is a rear view of the COB substrate.
Figure 9:
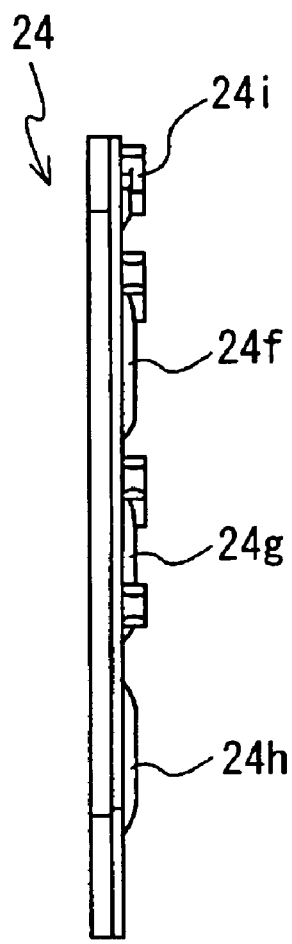
FIG. 9 is a right-hand side view of the COB substrate.
Figure 10:
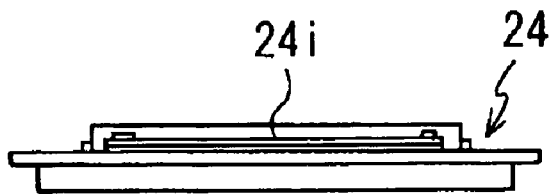
FIG. 10 is a plan view of the COB substrate.

Next, the construction of the COB substrate 24 will be described with reference to FIGS. 7 through 10. The COB substrate 24 is a substantially rectangular printed wiring board. The COB substrate 24 has through-holes 24a and 24b in the lower portion for passing the fixation shaft portions 26 and 27 therethrough. Further, as shown in FIGS. 8 and 9, drive IC chips 24f, 24g, and 24h are provided at the center of the back surface of the COB substrate 24. Further, a terminal row 24d is provided in the left-hand end portion of the back surface of the COB substrate 24 for soldering the flexible circuit board 15. A terminal row 24c is provided in the right-hand end portion of the back surface of the COB substrate 24 for soldering the flexible circuit board 16 thereto. As shown in FIGS. 8 through 10, a connector 24i is provided in the upper end portion of the back surface of the COB substrate 24. The connector 24i is engaged with a flexible flat cable (not shown) extending from a control circuit board (not shown) fixed to the casing 2 outside the carriage 10. Further, some electric parts such as several chip resistors and chip capacitors are also provided on the back surface of the COB substrate 24. The COB substrate 25 has the same construction.

Further, as shown in FIGS. 1 through 3, the COB substrate 24 and the COB substrate 25 are superimposed one upon the other with a fixed gap therebetween to be fixed to the vertical plate 10b of the carriage 10. The COB substrate 24 and the COB substrate 25 are fixed to the vertical plate 10b of the carriage 10 such that their planes (the obverse and reverse surfaces) are parallel to the moving direction of the carriage 10 and parallel to the gravitational direction. The space defined by the boards 24 and 25 is open upwardly. Preferably, any member but the casing 2 is not arranged above the space. On the other hand, the COB substrate 24 and the COB substrate 25 are heated by heat generated from the drive ICs mounted thereon. The main surfaces of the COB substrates 24, 25 are parallel to the moving direction of the carriage 10, so that the COB substrates 24, 25 are air-cooled as the carriage 10 reciprocates. Further, the planes (the obverse and reverse surfaces) of the COB substrate 24 and the COB substrate 25 are parallel to the gravitational direction. Accordingly, the air around the COB substrates 24 and 25 is reduced in specific gravity due to the heat generation of the COB substrates 24 and 25 to move upwards (in the direction opposite to the gravitational direction). Thus, the COB substrate 24 and the COB substrate 25 are readily cooled.

Figure 11:
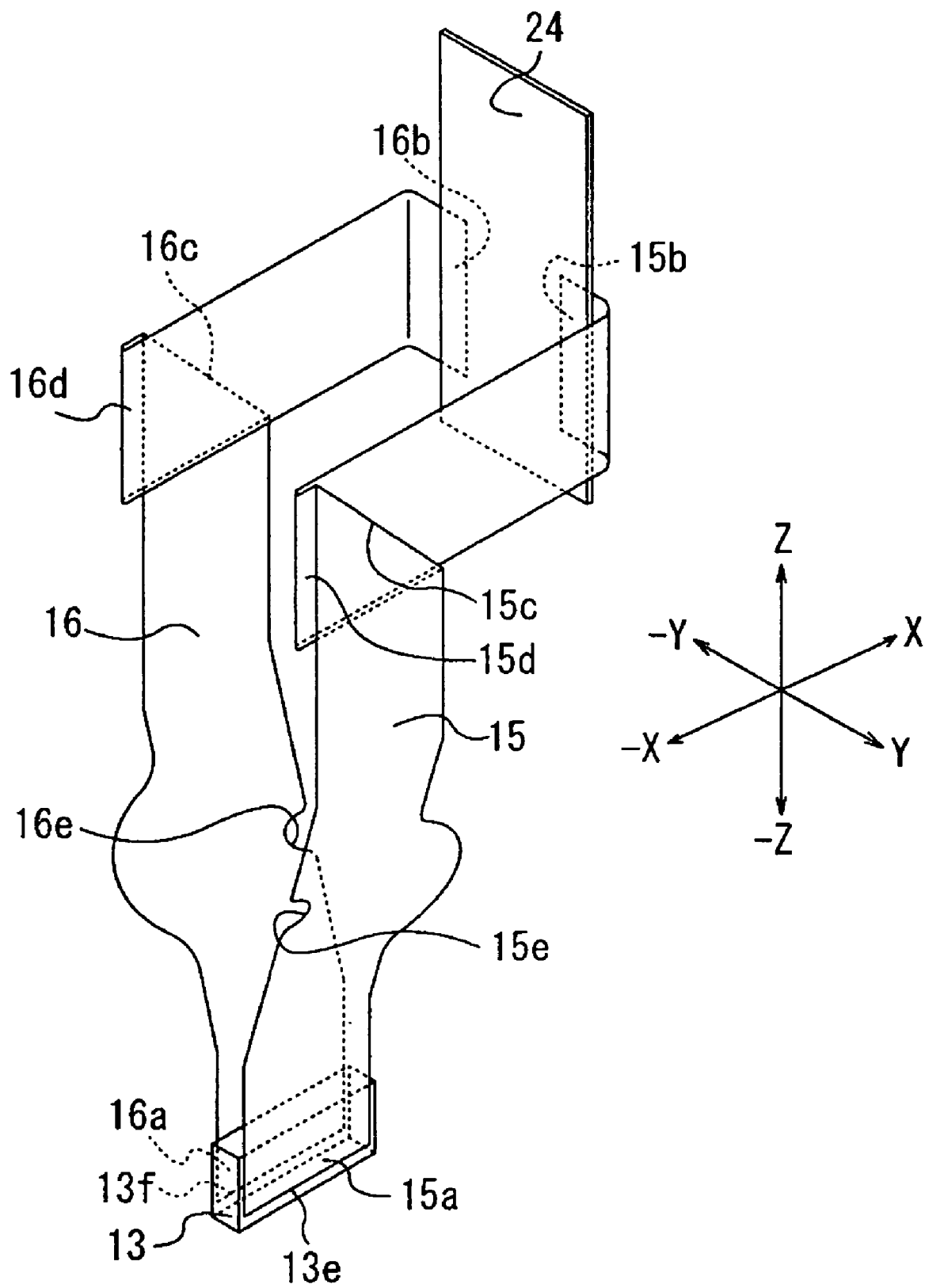
FIG. 11 is a perspective view showing the connection between an ink jet recording head and a COB substrate through a flexible circuit board according to an embodiment of the present invention.
Figure 12:
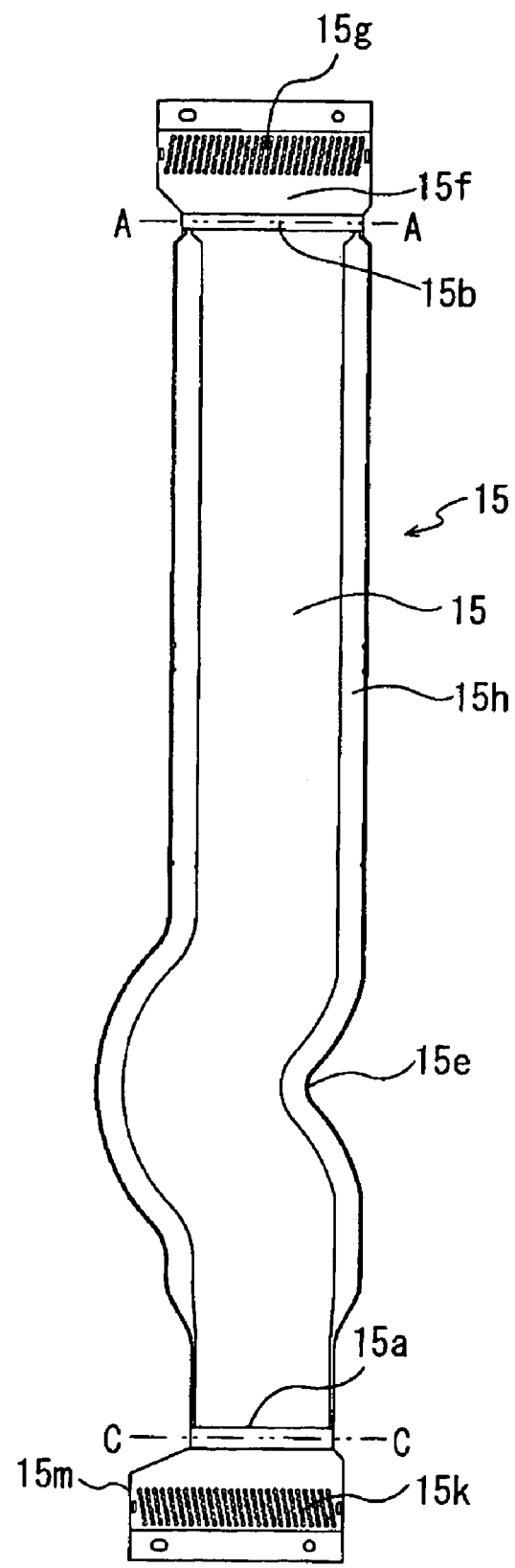
FIG. 12 is a plan view showing a flexible circuit board according an embodiment of the present invention prior to soldering.
Figure 13:
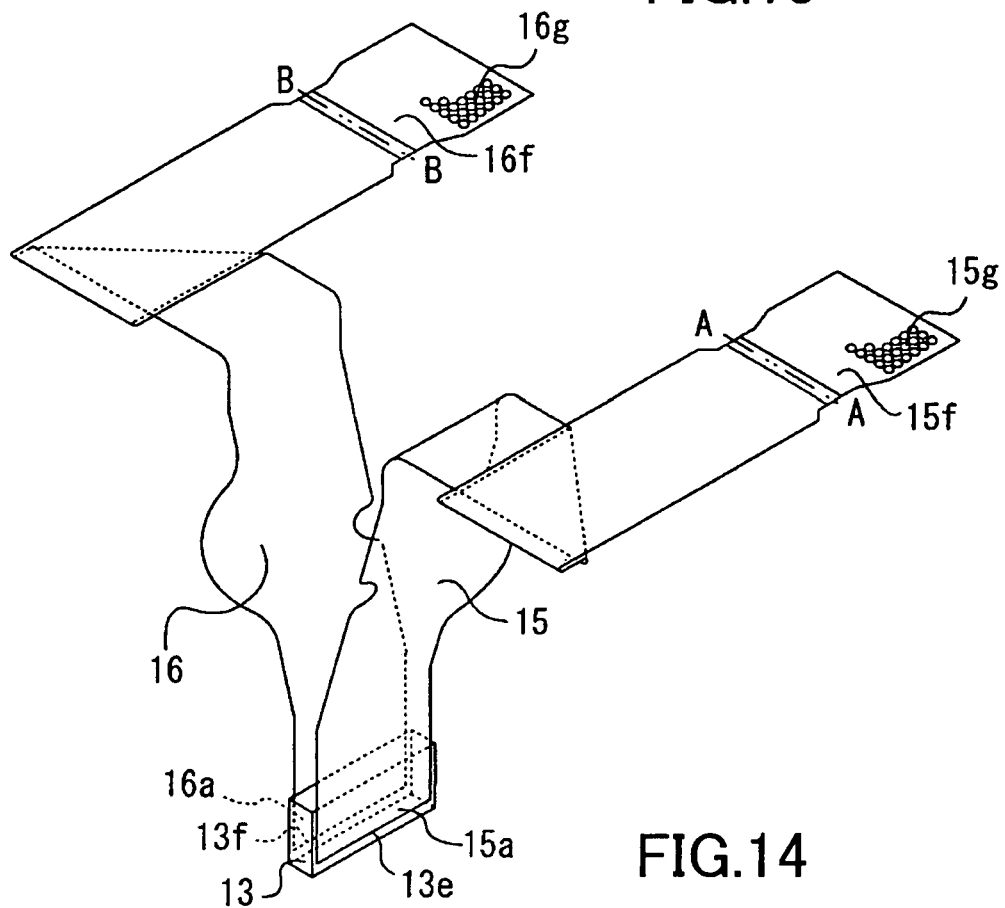
FIG. 13 is a perspective view showing an ink jet recording head soldered to the flexible circuit board according an embodiment of the present invention.
Figure 14:
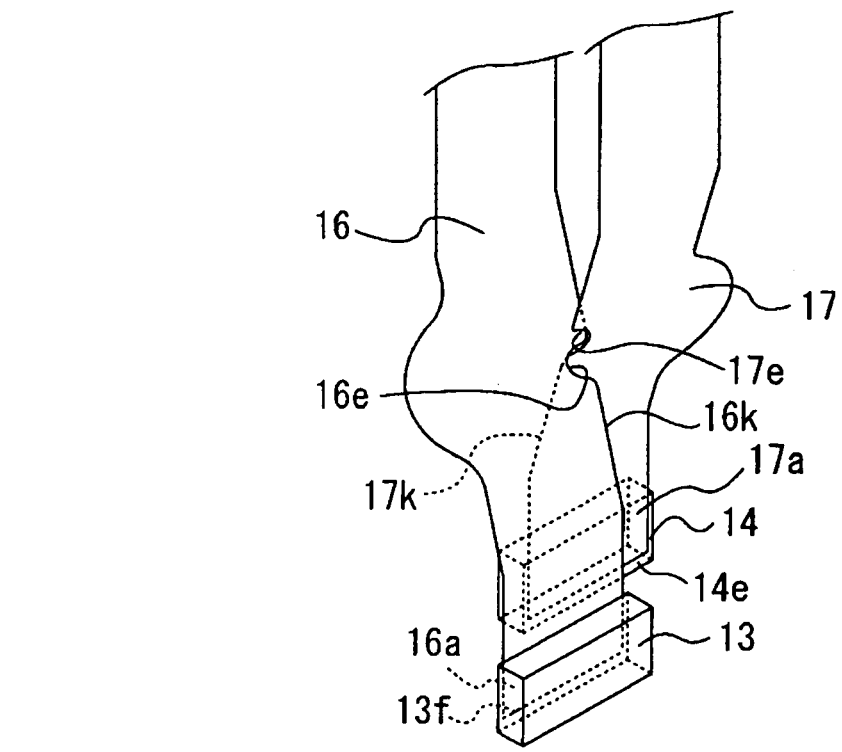
FIG. 14 is a perspective view showing the positional relationship between a pair of flexible circuit boards according to an embodiment of the present invention.
Figure 15:
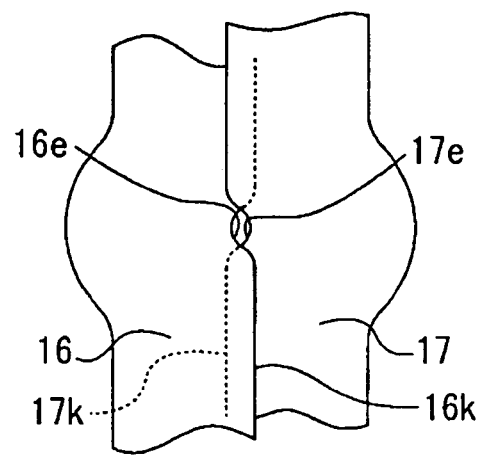
FIG. 15 shows the positional relationship between the pair of flexible circuit boards.
Figure 16:
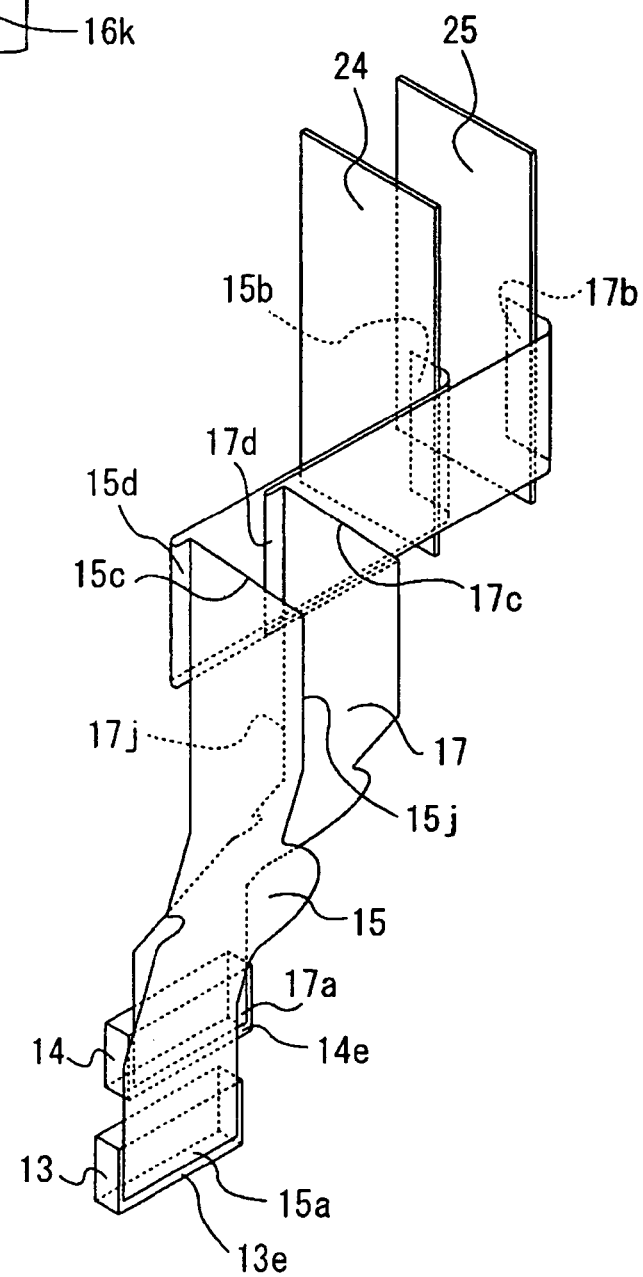
FIG. 16 is a perspective view showing the positional relationship between a flexible circuit board connected to a first ink jet recording head and another flexible circuit board connected to a second ink jet recording head.
Figure 17:
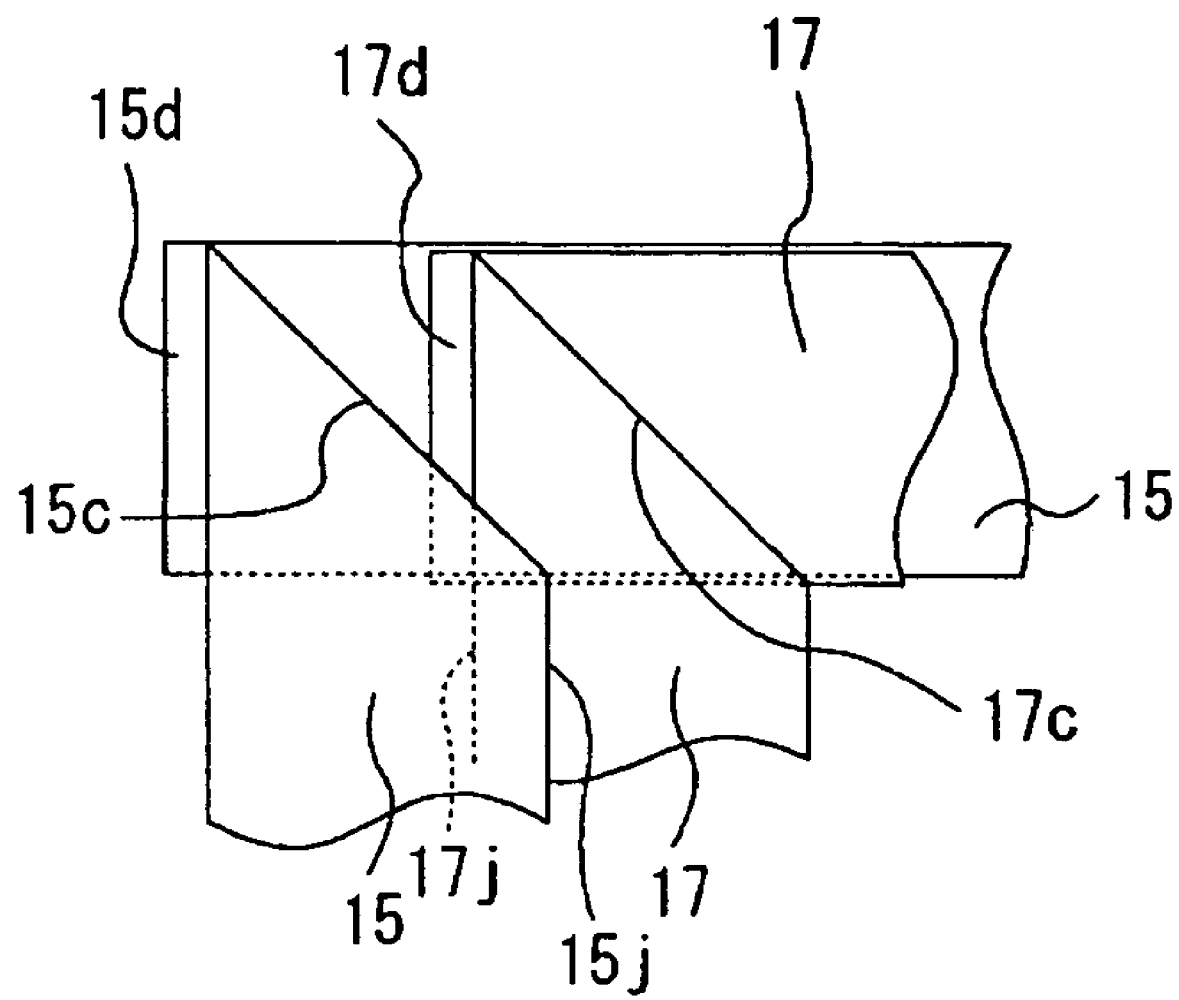
FIG. 17 is a view showing the positional relationship between a flexible circuit board connected to a first ink jet recording head and another flexible circuit board connected to a second ink jet recording head.

Next, the construction of the flexible circuit boards 15 through 18 will be described in detail with reference to FIGS. 11 through 17. FIG. 11 is a perspective view showing the connection between the ink jet recording head 13 and the COB substrate 24 through the flexible circuit boards 15 and 16. FIG. 12 is a plan view showing the flexible circuit board 15 prior to soldering. FIG. 13 is a perspective view showing the flexible circuit boards 15 and 16 soldered to the recording head 13. FIGS. 14 and 15 are perspective views showing the positional relationship between the flexible circuit board 16 and the flexible circuit board 17. FIGS. 16 and 17 are perspective views showing the positional relationship between the flexible circuit board 15 and the flexible circuit board 17.

As shown in FIG. 11, one end portion 15a of the flexible circuit board 15 is soldered to the connection terminal row (not shown) on the side surface 13e of the ink jet recording head 13. The flexible circuit board 15.then extends upwardly (in the Z-direction in FIG. 11) from the ink jet recording head 13, and is bent at a midpoint substantially at right angles with respect to the longitudinal direction of the flexible circuit board 15 to form a crease portion 15c. The forward end portion of the flexible circuit board 15 extends to the left (the –X-direction in FIG. 11), and is then folded back by 180 degrees to form a crease portion 15d. Further, the forward end portion of the flexible circuit board 15 extends to the right (the X-direction in FIG. 11). The forward end portion 15b of the flexible circuit board 15 is then soldered to the terminal row 24d provided on the back surface of the COB substrate 24 (See FIG. 8).

Further, as shown in FIG. 11, one end portion 16a of the flexible circuit board 16 is soldered to the connection terminal row (not shown) on the side surface 13f of the ink jet recording head 13. The flexible circuit board 16 extends upwardly (in the Z-direction in FIG. 11) from the ink jet recording head 13, and is they bent at a midpoint substantially at right angles with respect to the longitudinal direction of the flexible circuit board 16 to form a crease portion 16c. The forward end portion of the flexible circuit board 16 extends to the left (the –X-direction in FIG. 11), and is then folded back by 180 degrees to form a crease portion 16d. Further, the forward end portion of the flexible circuit board 16 extends to the right (the X-direction in FIG. 11). The forward end portion 16b of the flexible circuit board 16 is soldered to the terminal row 24c provided on the back surface of the COB substrate 24 (See FIG. 8). In other words, the crease portions 15c and 15d of the flexible circuit board 15 and the crease portions 16c and 16d of the flexible circuit board 16 are related substantially as object and mirror image. Each of the crease portions is fixed in position by adhesive tape or adhesive.

As described below, the flexible circuit board 15 has a lot of conductors (circuit patterns) 15i printed on only one side of a resin plate (strip-like thin plate) 15h formed as a flexible strip-like insulator (as is the same with the board 16). Even if the side on which the circuit patterns 15*i* are exposed is reversed by the crease portion 15*c* substantially at right angles, the circuit patterns 15*i* are exposed on the same side by the crease portion 15*d* at 180 degrees. Thus, the soldering surface at the one end portion 15*a* of the flexible circuit board 15 and the soldering surface at the one end portion 16*a* of the flexible circuit board 16 are opposed to each other through the ink jet head 13. The soldering surface of the forward end portion 15*b* of the flexible circuit board 15 and the soldering surface of the forward end of portion 16*b* of the flexible circuit board 16 are opposed to each other prior to their soldering to the COB substrate 24. It should be noted that the flexible circuit boards 17 and 18 to be soldered to the ink jet recording head 14 and the COB substrate 25 have th e same construction as the flexible circuit boards 15 and 16.

Next, the construction of the flexible circuit board 15 will be described with reference to FIG. 12. As shown in FIG. 12, the flexible circuit board 15 has a strip-like thin plate 15*h* of a flexible and insulating resin such as polyimide, circuit patterns 15*i* formed by several copper foil conductors on one side of the thin plate 15*h*, and an insulating film covering the circuit patterns 15*i*. Further, the flexible circuit board 15 has end portions 15*f*, 15*m* extending from the exposed circuit pattern 15*i* at both ends 15*a*, 15*b* of the longitudinal direction of the flexible circuit board 15. A lot of check electrode portions 15*k* and 15*g* connected to the circuit patterns 15*i* are respectively formed in the portions 15*f* and 15*m*. After the production of the flexible circuit board 15, a voltage is applied to the check electrode portions 15*k* and 15*g* to examine continuity to each of the circuit patterns 15*i*.

The flexible circuit boards 16 through 18 have the same configuration and the same circuit pattern as the flexible circuit board 15. The flexible circuit boards 15 and 16 only differ from the flexible circuit boards 17 and 18 in the folding directions. Thus, it suffices to prepare only one kind of flexible circuit board. In each of the flexible circuit boards (of which the flexible circuit board 15 will be described), the extension portion 15*m* at one end 15*a* is separate from the flexible circuit board 15 along the line C-C. The circuit patterns 15*i* are soldered to respective ones of the connection terminals of the recording head 13, individually.

Next, a test on the flexible circuit board 15 using the electrode portion 15*f* for flexible circuit board pattern check and the ink jet recording head 13 will be described. The flexible circuit boards 15 and 16 are soldered to the side surfaces 13*e* and 13*f* of the ink jet recording head 13 as described above. The electrode portion 15*f* for flexible-circuit-board pattern check of the flexible circuit board 15 has an electrode terminal 15*g*. The electrode portion 16*f* for flexible-circuit-board pattern check of the flexible circuit board 16 has an electrode terminal 16*g*. The electrode terminals 15*g*, 16*g* are connected to a testing device (not shown) to examine the continuity between the ink jet recording head 13 and the flexible circuit boards 15, 16. Further, drive pulse signal is sent to the recording head 13 to examine the operations of the ink jet recording head 13. If the test result is satisfactory, the flexible circuit boards 15 and 16 are cut off along the lines A-A and B-B. The circuit patterns at the forward end portions of the flexible circuit boards 15 and 16 are then soldered to the terminal rows 24*c* and 24*d* of, the COB substrate 24, respectively. It should be noted that the flexible circuit boards 17 and 18 and the ink jet recording head 14 are tested in the same manner.

Next, the construction and effect of curved portions provided in the flexible circuit boards 15 through 18 will be described with reference to FIGS. 3, 4, 12, 14, and 15. As shown in FIG. 12, the flexible circuit board 15 has a curved portion 15*e* bent so as to be recessed in the width direction perpendicular to the longitudinal direction of the flexible circuit board 15. It should be noted that each of the flexible circuit boards 16 through 18 also has a curved portion of the same configuration as the curved portion 15*e*.

As shown in FIGS. 4 and 14, these curved portions 15*e* are provided in order to prevent interference between the side end portions of the flexible circuit boards 16 and 17 crossing each other. More specifically, as shown in FIG. 4, the flexible circuit board 16 is connected to the left-hand side surface (as seen in FIG. 4) of the ink jet recording head 13, and extends toward the left-hand side surface (as seen in FIG. 4) of the COB substrate 24. The flexible circuit board 17 is connected to the right-hand side surface (as seen in FIG. 4) of the ink jet recording head 14, and extends toward the right-hand side surface (as seen in FIG. 4) of the COB substrate 25 provided on the back side of the COB substrate 24. If the recording heads 13 and 14 are offset in the direction perpendicular to the moving direction of the carriage 10, the adjacent end portions of the recording heads 13, 14 overlap each other when seen from the carriage moving direction, because of the constraint that the distance between the nozzles near the adjacent end portions of the recording heads must be equal to that of the other adjacent nozzle on the recording head 13. Further, when the interval of the conductors of the circuit patterns of each flexible circuit board is substantially equal to or more than the nozzle interval, the width of the resin plate 15*h* becomes larger than the width of the circuit patterns. Therefore, the side end portion of the flexible circuit board 16 and the side end portion of the flexible circuit board 17 interfere with each other.

As shown in FIGS. 14 and 15, the recesses of the curved portions 16*e* and 17*e* are opposed to each other in the mutually opposing side end portions 16*k* and 17*k* of the flexible circuit board 16 and the flexible circuit board 17. Therefore, the side end portions 16*k* and 17*k* of the flexible circuit boards 16 and 17 crossing each other interchange their position without interfering with each other, thereby preventing damage or breakage.

Next, with reference to FIGS. 16 and 17, a construction in which the crease portion 17*d* of the flexible circuit board 17 is held in the crease portion 15*d* of the flexible circuit board 15 will be described. As shown in FIG. 16, one end portion 15*a* of the flexible circuit board 15 is soldered to the side surface 13*e* of the ink jet recording head 13. The forward end portion 15*b* of the flexible circuit board 15 is soldered to the right-hand end portion (as seen in FIG. 16) of the back surface of the COB substrate 24. Further, one end portion 17*a* of the flexible circuit board 17 is soldered to the side surface 14*e* of the ink jet recording head 14. The forward end portion 17*b* of the flexible circuit board 17 is soldered to the right-hand end portion (as seen in FIG. 16) of the back surface of the COB substrate 25.

Here, the portions of the COB substrate 24 and the COB substrate 25 to which the flexible circuit boards are soldered are at the same height, so that the flexible circuit board 17 extending from the crease portion. 17*d* to the COB substrate 25 overlaps the flexible circuit board 15 extending from the crease portion 15*d* to the COB substrate 24 on the outer side (on the right-hand side as seen in FIG. 16). Further, the flexible circuit board 17 extending from the crease portion 17*c* to the ink jet recording head 14 is on the left-hand side as seen in FIG. 16 with respect to the flexible circuit board 15 extending from the crease portion 15*c* toward the ink jet recording head 13. Therefore, in spite of that the two flexible circuit boards have to be interchanged in lateral position at a midpoint, the widths of the two flexible circuit boards are in an overlapping relationship when the two recording heads 13 and 14 are seen sidewise for the same reason as stated above. Therefore, the flexible circuit boards 15, 17 interfere with each other, which may cause the flexible circuit boards 15 and 17 to interfere with each other and then be damaged and/or broken.

In this embodiment, in order to protect the side end portion 15j of the flexible circuit board 15 and the side end portion 17j of the flexible circuit board 17, the crease portion 17d of the flexible circuit board 17 is held in the crease portion 15d of the flexible circuit board 15, as shown in FIGS. 16 and 17. The above arrangement allows the flexible circuit boards 15, 17 to interchange each other without the side end portions thereof interfering with each other. The above arrangement prevents the flexible circuit boards 15, 17 from freely swinging separately. The flexible circuit boards 16 and 18 are constructed in the same manner.

Figure 18:
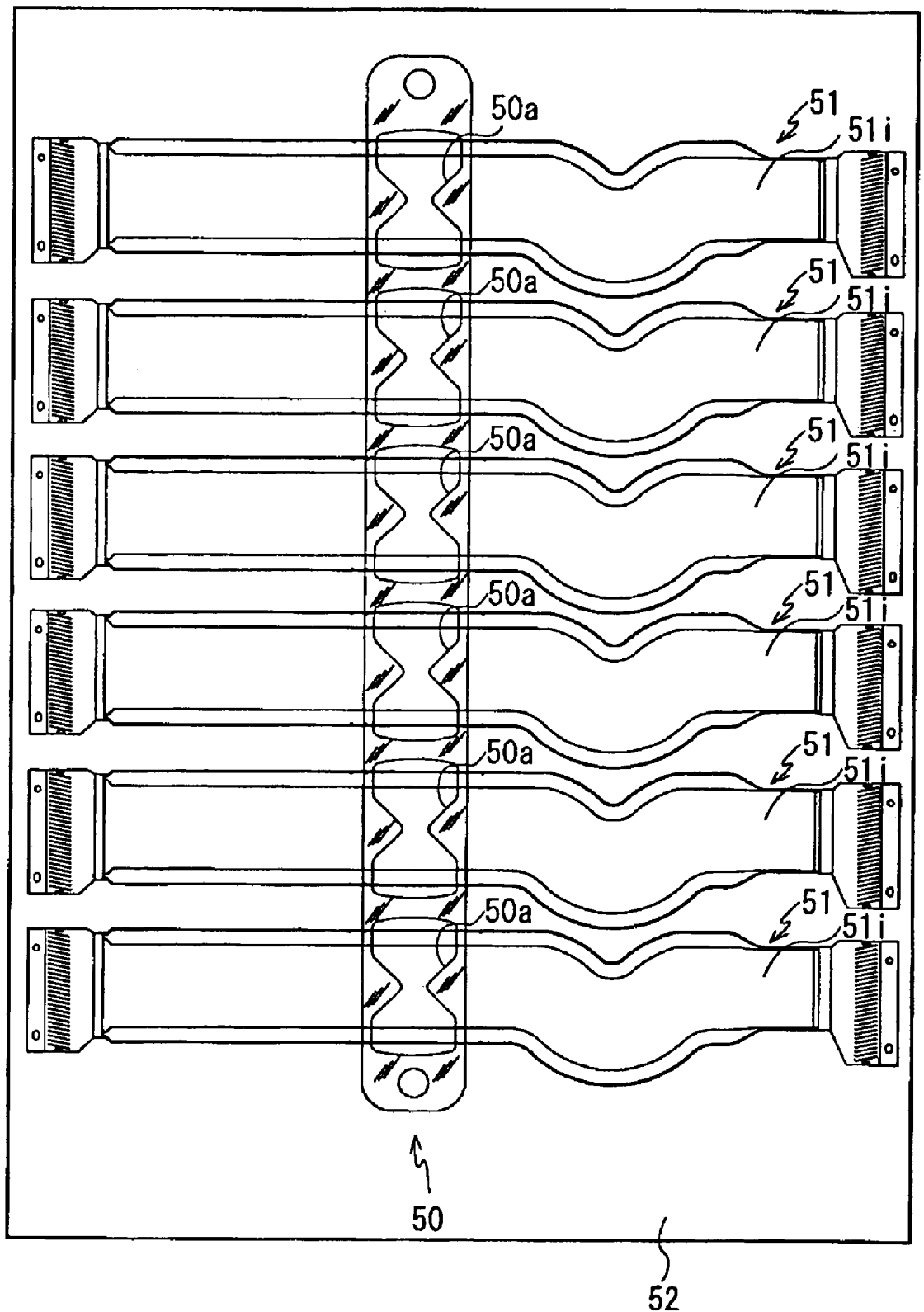
FIG. 18 is a plan view showing several flexible circuit boards with a sheet-like double-faced tape being provided thereon in one process for manufacturing the flexible circuit board.
Figure 19A:
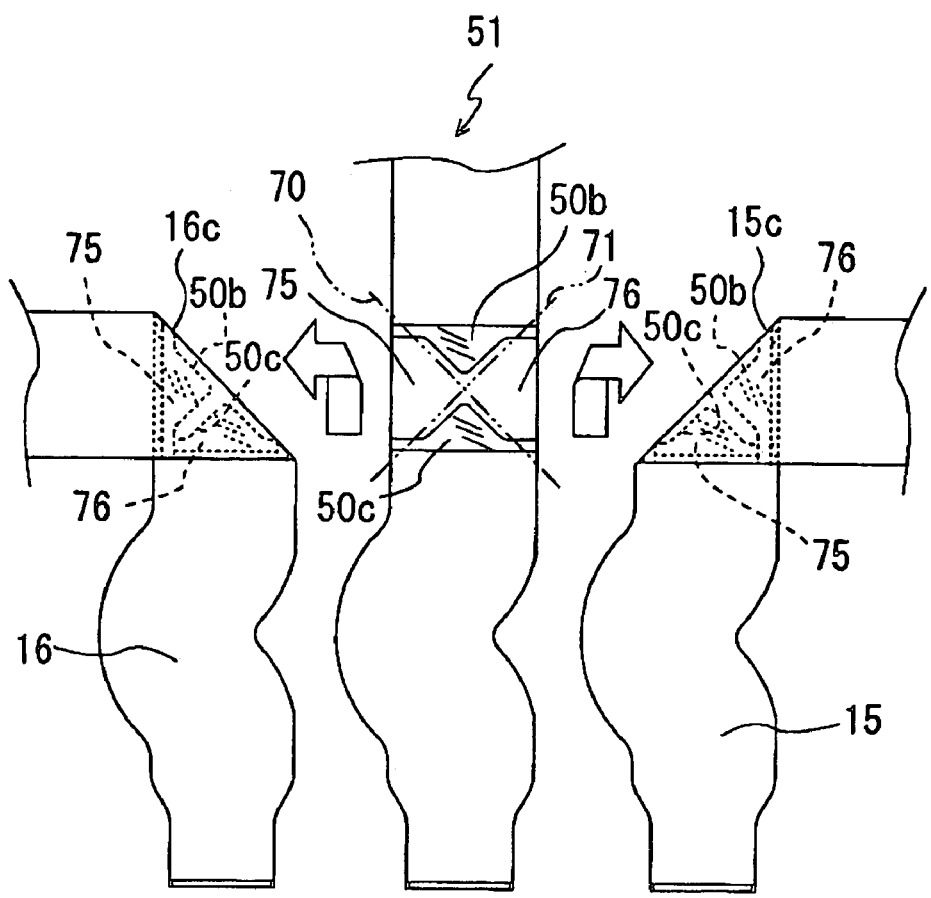
FIG. 19(a) is a view showing that the flexible circuit board of FIG. 18 is bent to the left and to the right.

Next, the adhesion structure for the crease portions 15c and 16c of the flexible circuit boards 15 and 16 will be described with reference to FIGS. 18 and 19(a). FIG. 18 is a plan view showing a board sheet 52 prior to die cutting of a lot of flexible circuit boards 51 having a sheet-like double-faced tape 50 in the process for manufacturing flexible circuit boards. FIG. 19(a) shows the die cut flexible circuit boards 51 bent to the right and left and then attached together by the double-faced tapes 50b and 50c.

As shown in FIG. 18, in order to form several flexible circuit boards 51 in the form of strip-like thin plates, a plurality of circuit patterns 51i consisting of a plurality of copper foil conductors are formed at predetermined intervals in the board sheet 52 of a flexible and insulating resin such as polyimide. An insulating film for covering the circuit patterns 51i is formed on the board sheet 52. Further, a substantially rectangular sheet-like double-faced tape 50 is attached to several flexible circuit boards 51. More specifically, the sheet-like double-faced tape 50 is attached to the flexible circuit board 51 such that the longitudinal direction of the tape 50 is substantially parallel to the width direction of the flexible circuit boards 51 (so as to be perpendicular to the longitudinal direction of the flexible circuit boards 51). This structure assists to eliminate operations required to attach the double-faced tapes 50 to the flexible circuit boards 51. Further, this structure allows the flexible circuit boards to simultaneously be die cut integrally with the double-faced tapes 50.

Further, the sheet-like double-faced tape 50 has hand-drum-shaped cut portions 50a. In each of the flexible circuit boards 51, each cut portion 50a diverges from substantially the central portion with respect to the width direction to the edge ends. The double-faced tape 50 is attached to the flexible circuit board 51 such that the crease line at which the flexible circuit board is bent and the line perpendicular to the crease line are contained in this hand-drum-shaped cut portion 50a. Thus, as shown in FIG. 19(a), after die cutting each flexible circuit board 51 with a cutter (not shown), four regions of a substantially right-angle-isosceles-triangular configuration are defined by the crease line 70 or 71 of the flexible circuit board 51 and the line 71 or 70 perpendicular to the crease line. Among four regions, two regions with the double-faced tape 50b and the double-faced tape 50c of a substantially right-angle-isosceles-triangular area remain respectively in the flexible circuit board 51 in the longitudinal direction.

And, when the flexible circuit board 51 is bent at the crease line 71 frontward to the right as seen in FIG. 19(a), the double-faced tape 50b adheres to the adhesion surface 76 opposed thereto, and the double-faced tape 50c adheres to the adhesion surface 75 opposed thereto, thereby forming the flexible circuit board 15. Further, when the flexible circuit board 51 is bent at the crease line 70 frontward to the left as seen in FIG. 19(a), the double-faced tape 50b adheres to the adhesion surface 75 opposed thereto, and the double-faced tape 50c adheres to the adhesion surface 76 opposed thereto, thereby forming the flexible circuit board 16. Thus, depending on which the flexible circuit board 51 is bent to the right or to the left, the double-faced tape 50b or 50c adheres to the adhesion surface 75 or the adhesion surface 76. Therefore, the adhesion of the crease portions 15c and 16c is reliably effected.

Figure 19B:
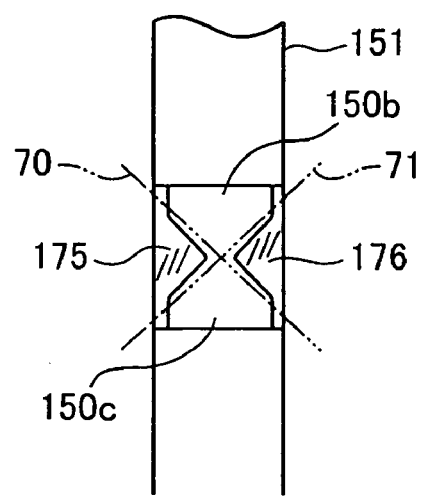
FIG. 19(b) is a view showing the flexible circuit board on which the area for the double-faced tape is changed.

As described above, the double-faced tape 50b or 50c is formed by the rest of the sheet-like double-faced tape 50 after the hand-drum-shaped portions are cut off therefrom. No double-faced tape covers the crease lines 70 and 71 of the flexible circuit board 51 (In other words, the double-faced tape is attached in the only vicinity of the crease line spaced apart therefrom). Therefore, the attachment of the crease line 70 or 71 can be effected firmly. In this embodiment, the adhesion with double-faced tapes is used in order to adhere the crease portions 15c and 16c. In another embodiment, other adhesion method can be used to adhere the crease portions 15c and 16c. For example, it is possible to use a silicone type adhesive, a photo-setting adhesive, or an epoxy resin adhesive. The above-described adhesion structure is applicable to the flexible circuit boards 17 and 18 as well as the flexible circuit boards 15 and 16. As shown in FIG. 19(b), the flexible circuit board 151 may have double-faced tape regions 175 and 176 in the width direction without leaving double-faced tape in the longitudinal direction of a flexible circuit board 151. In this case, no double-faced tape is provided in regions 150b and 150c. In other words, the arrangement is reverse to that of FIG. 19(a) in terms of double-faced tape provision region.

As described above, in the ink jet printer 1 of this embodiment, by bending the flexible circuit board 15 having the configuration and circuit pattern as shown in FIG. 12 at right angles and by 180 degrees. Two different types of the flexible circuit boards 15 through 18 having symmetrical configurations can be formed. Because the flexible circuit boards 15 through 18 have curved portions and crease portions, it is possible to prevent the flexible circuit boards 15 through 18 from being damaged or broken. Further, heat dissipation can be effected to a sufficient degree on the COB substrates 24 and 25. The positioning of the head module 11 with respect to the carriage 10 can be readily performed.

Further, four regions of a substantially right-angle-isosceles-triangular configuration in each flexible circuit board are defined by the crease line of the crease portion bent at right angles and the line perpendicular to the crease line. Among the four regions, a longitudinal pair of regions is provided with double-faced tapes of a substantially right-angle-isosceles-triangular configuration. Each double-faced tape adheres to an adhesion surface on the flexible circuit board. This structure utilizes the fact that the adhesion force between double-faced tape and flexible circuit board is stronger than the adhesion force between double-faced tapes. Further, the double-faced tapes are provided so as not to overlap the crease lines of the crease portions. As a result, the crease line is formed properly, when each flexible circuit board is bent at right angles.

Figure 20:
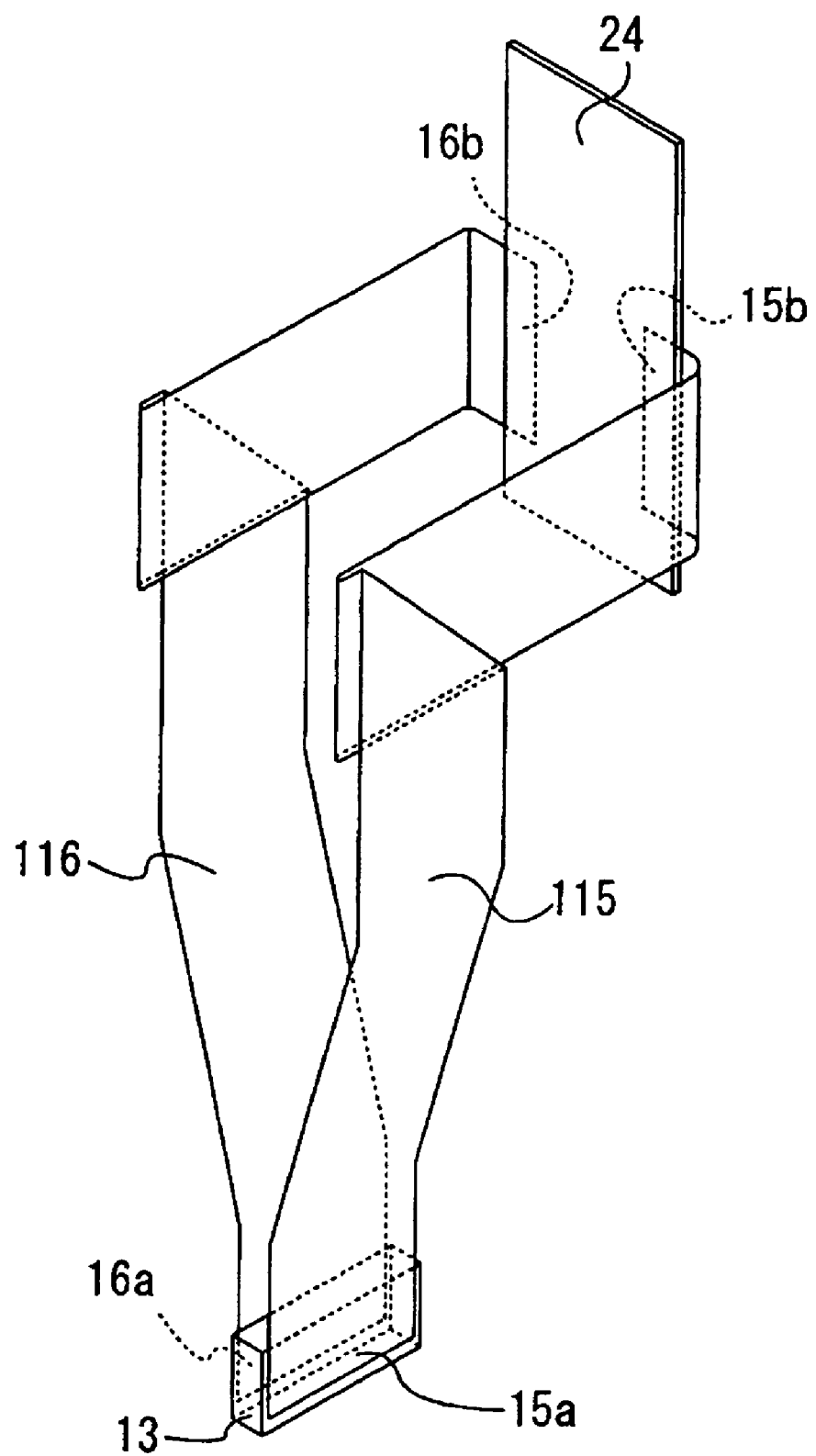
FIG. 20 is a perspective view showing a modification of the flexible circuit board in the present invention.
Figure 21:
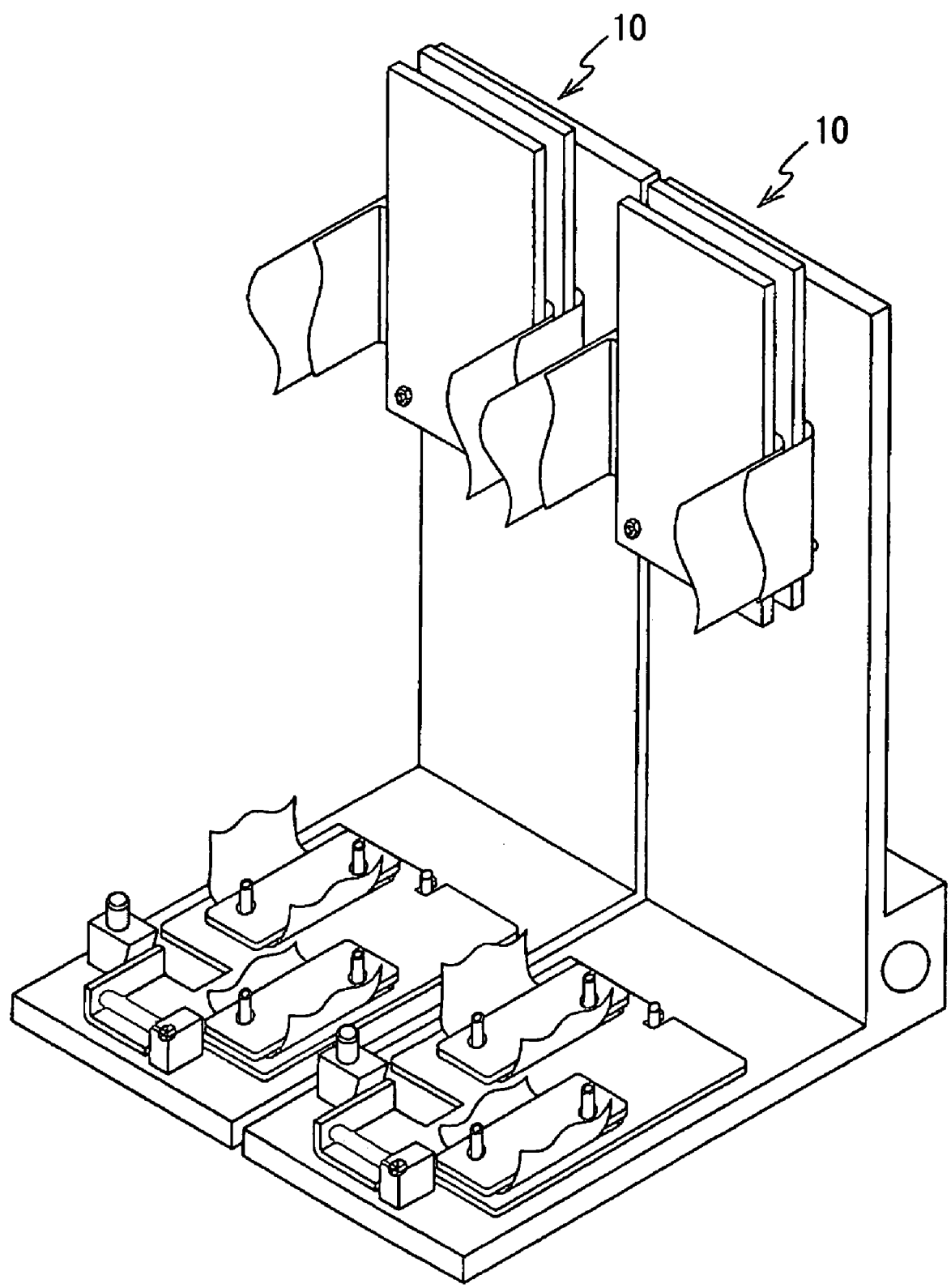
FIG. 21 is a perspective view showing a modification of the carriage in this invention.
Figure 22:
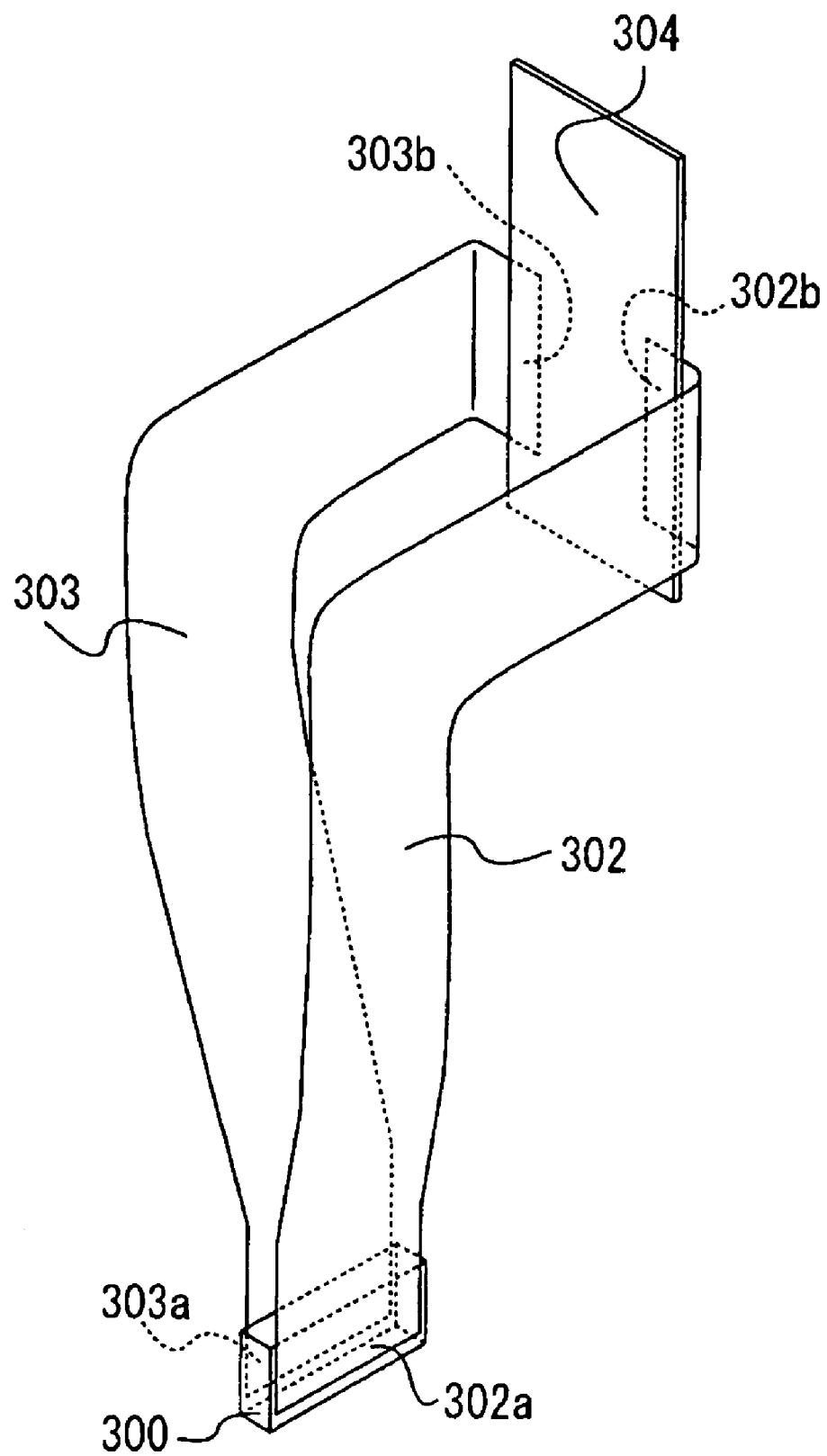
FIG. 22 is a perspective view of a conventional flexible circuit board.

It should be noted that the present invention is not restricted to the above-described embodiments. Various modifications are made within the scope of the present invention. A modification of the present invention will be described with reference to FIGS. 20 and 21. FIG. 20 is a perspective view of a modification of the flexible circuit board. FIG. 21 is a perspective view of a modification of the carriage. Referring to FIG. 20, the flexible circuit boards 115 and 116 can be used with no curved portions, when only one recording head 1 is used in a carriage. The flexible circuit boards 115 and 116 have only the right-angle and 180 degrees crease portions. Further, as shown in FIG. 21, it is also possible to connect a plurality of carriages in tandem instead of using a single carriage. In the above-described embodiment, a single head module 11 is mounted on a single carriage. In addition, it is in the scope of the invention to provide a carriage with head modules 11 for four colors of cyan, magenta, yellow, and black mounted thereon. Further, the method for connecting the flexible circuit board to the ink jet recording head and the COB substrate is not restricted to soldering. It is also within the scope of the invention to use a conductive adhesive in order to connect the flexible circuit board and the recording head or the COB substrates. Further, it is also possible to stack together three or more COB substrates at fixed intervals and secure them in-position.

INDUSTRIAL APPLICABILITY

The present invention is applicable not only to a printer but also to various image forming apparatuses, such as a copying machine and a facsimile apparatus. In particular, in a high-speed image forming apparatus in which the carriage reciprocates at high speed, the flexible circuit board can provide a stable connection between the head and the drive circuit board. Further, the device of the present invention is of great practical value due to its ease of production.

The invention claimed is:

1. A recording apparatus comprising:
   a recording head recording on a recording medium;
   a drive circuit board sending out a signal for driving the recording head; and
   a pair of flexible circuit boards, each of which has a flexible strip-like insulator and a plurality of conductors arranged on the strip-like insulator, the pair of flexible circuit boards transmitting the signal from the drive circuit board to the recording head; wherein
   the recording head has a pair of opposing connecting portions for receiving the signal;
   the drive circuit board has a pair of connecting portions situated substantially at a right angle with respect to planes containing the connecting portions of the recording head, the pair of connecting portions being connected to the pair of flexible circuit boards; and
   the pair of flexible circuit boards are paired with the connecting portions of the recording head, respectively, connecting portions of the pair of flexible circuit boards connected to the connecting portions of the recording head are opposed to each other, and each of the pair of flexible circuit boards includes a first portion that is bent substantially at a right angle with respect to the longitudinal direction between the recording head and the drive circuit board and a second portion that is folded back by 180 degrees such that the first portion lies flat against the second portion.

2. A recording apparatus according to claim 1, wherein portions of the pair of flexible circuit boards connected to the drive circuit board are opposed to each other prior to the connection to the drive circuit board.

3. A recording apparatus according to claim 2, wherein the portions of the pair of flexible circuit boards connected to the drive circuit board are connected to the same side of the drive circuit board.

4. A recording apparatus according to claim 1, wherein the pair of flexible circuit boards are made of flexible circuit boards of the same configuration and the same electric circuit.

5. A recording apparatus according to claim 1, wherein the recording head is provided with a plurality of recording elements arranged in two rows and the pair of connecting portions of the recording head are provided on side surfaces parallel to the rows of recording elements.

6. A flexible circuit board connecting a recording head to a drive circuit board, the recording head recording on a recording medium, the drive circuit board sending out a signal for driving the recording head, comprising:
   a flexible strip-like insulator; and
   a plurality of conductors arranged on the strip-like insulator, the flexible circuit board transmitting the signal from the drive circuit board to the recording head, wherein
   the flexible circuit board includes a first portion that is bent substantially at a right angle with respect to the longitudinal direction thereof and a second portion that is folded back by 180 degrees such that the first portion lies flat against the second portion.

7. A recording head unit comprising:
   a recording head recording on a recording medium; and
   a pair of flexible circuit boards, each of which has a flexible strip-like insulator and a plurality of conductors arranged on the strip-like insulator, the pair of flexible circuit boards transmitting a signal from a drive circuit board to the recording head; wherein
   each of the pair of flexible circuit boards is provided with a connecting portion connectable to the drive circuit board, another connecting portion connectable to the recording head, and an electrode portion extends from the connecting portion for checking continuity to the recording head, each of the pair of flexible circuit boards includes a first portion that is bent substantially at a right angle with respect to a longitudinal direction and a second portion that is folded back by 180 degrees such that the first portion lies flat against the second portion.

8. A recording head unit according to claim 7, wherein the electrode portion is separable from the connecting portion for connection to the drive circuit board.

9. A recording head unit according to claim 7, wherein
   the recording head has a pair of opposing connecting portions for receiving the signal;
   the pair of flexible circuit boards is paired with the connecting portions of the recording head, respectively, and connecting portions of the connected to the connecting portions of the recording head are opposed to each other.

10. A method of manufacturing a recording head unit having a pair of flexible circuit boards connecting a recording head to a drive circuit board, the recording head recording on a recording medium, the drive circuit board sending a signal for driving the recording head, the pair of flexible circuit boards, each of which has a flexible strip-like insulator and a plurality of conductors arranged on the strip-like insulator, the pair of flexible circuit boards transmitting the signal from the drive circuit board to the recording head, the method comprising:

providing a connecting portion for connection to the drive circuit board at one end of each of the pair of flexible circuit boards, and forming an electrode portion extending from the connecting portion for checking continuity to the recording head;

bending each of the pair of flexible circuit boards at a right angle with respect to a longitudinal direction thereof in order to form a first portion and folding back by 180 degrees in order to form a second portion such that the first portion lies flat against the second portion;

connecting another end of each of the pair of flexible circuit-boards to the recording head;

applying a signal to the electrode portion for checking operations of the recording head; and separating the electrode portion from each of the pair of flexible circuit boards, and connecting the drive circuit board to the connecting portion.

11. The recording apparatus according to claim 1, wherein the pair of flexible circuit boards respectively has an identical shape and an identical circuit pattern.

12. The recording head according to claim 7, wherein the pair of flexible circuit boards respectively has an identical shape and an identical circuit pattern.

13. The method according to claim 10, wherein the pair of flexible circuit boards respectively has an identical shape and an identical circuit pattern.

* * * * *